US012763142B2

(12) United States Patent
Song et al.

(10) Patent No.: US 12,763,142 B2
(45) Date of Patent: Oct. 13, 2026

(54) SEMICONDUCTOR MEMORY DEVICE INCLUDING MEMORY CELLS

(71) Applicant: SAMSUNG ELECTRONICS CO., LTD., Suwon-si (KR)

(72) Inventors: Jung-Hak Song, Suwon-si (KR); Hyun-Jin Shin, Suwon-si (KR); Junsuk Lee, Suwon-si (KR); Chanho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 100 days.

(21) Appl. No.: 18/818,882

(22) Filed: Aug. 29, 2024

(65) Prior Publication Data

US 2025/0226030 A1 Jul. 10, 2025

(30) Foreign Application Priority Data

Jan. 9, 2024 (KR) ........................ 10-2024-0003866

(51) Int. Cl.
*G11C 13/00* (2006.01)
*H10B 61/00* (2023.01)
*H10B 63/00* (2023.01)

(52) U.S. Cl.
CPC ........ *G11C 13/004* (2013.01); *G11C 13/0026* (2013.01); *G11C 2013/0054* (2013.01); *H10B 61/22* (2023.02); *H10B 63/30* (2023.02)

(58) Field of Classification Search
CPC .............. G11C 13/004; G11C 13/0026; G11C 2023/0054; H10B 61/22; H10B 63/30
USPC .......................................................... 365/148
See application file for complete search history.

(56) References Cited

U.S. PATENT DOCUMENTS

| | | | | |
|---|---|---|---|---|
| 9,543,397 | B2 | 1/2017 | Kleemeier et al. | |
| 9,564,403 | B2 | 2/2017 | Allinger et al. | |
| 9,728,411 | B2 | 8/2017 | Alberti et al. | |
| 9,786,839 | B2 | 10/2017 | Bhushan et al. | |
| 9,847,473 | B2 | 12/2017 | Hsu et al. | |
| 11,056,492 | B1 | 7/2021 | Gomes et al. | |
| 11,398,596 | B2 | 7/2022 | Manipatruni et al. | |
| 2010/0181547 | A1 | 7/2010 | Kuroda | |
| 2017/0032842 | A1* | 2/2017 | Widjaja | H10D 30/711 |
| 2019/0386062 | A1 | 12/2019 | Wang | |
| 2020/0043980 | A1 | 2/2020 | Wang et al. | |

OTHER PUBLICATIONS

Extended European Search Report dated May 6, 2025 issued in corresponding European Patent Application No. 25150137.5.

* cited by examiner

*Primary Examiner* — Ly D Pham
(74) *Attorney, Agent, or Firm* — Morgan, Lewis & Bockius LLP

(57) ABSTRACT

A semiconductor memory device includes a first memory cell including a first variable resistor element and a first cell transistor connected to the first variable resistor element through a first source-drain electrode, a substrate having a first surface connected to the second source-drain electrode of the first cell transistor and a second surface opposing the first surface, a first bitline connected to the first source-drain electrode of the first cell transistor through the first variable resistor element, and a first source line disposed on the second surface of the substrate and connected to the second source-drain electrode.

20 Claims, 21 Drawing Sheets

【FIG. 1】
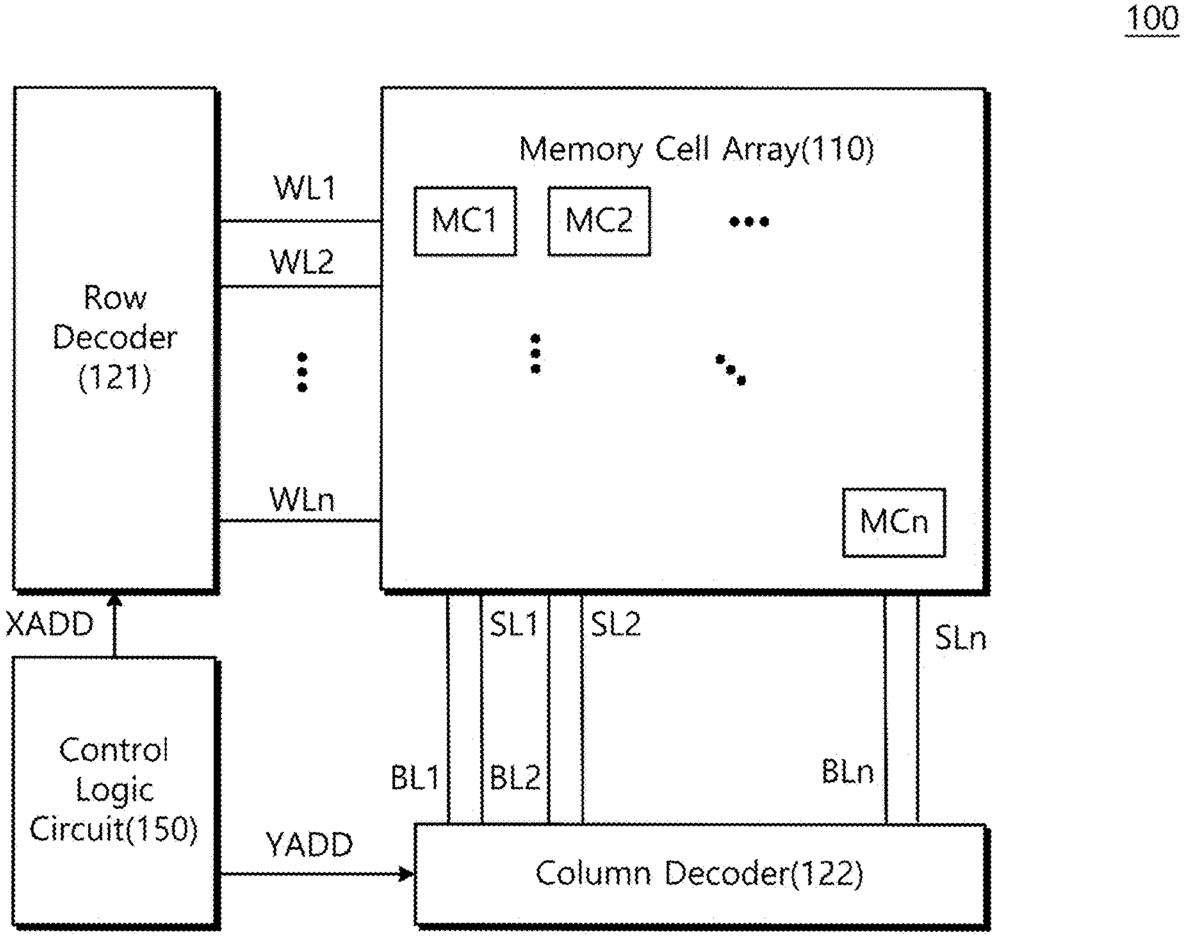

【FIG. 2】
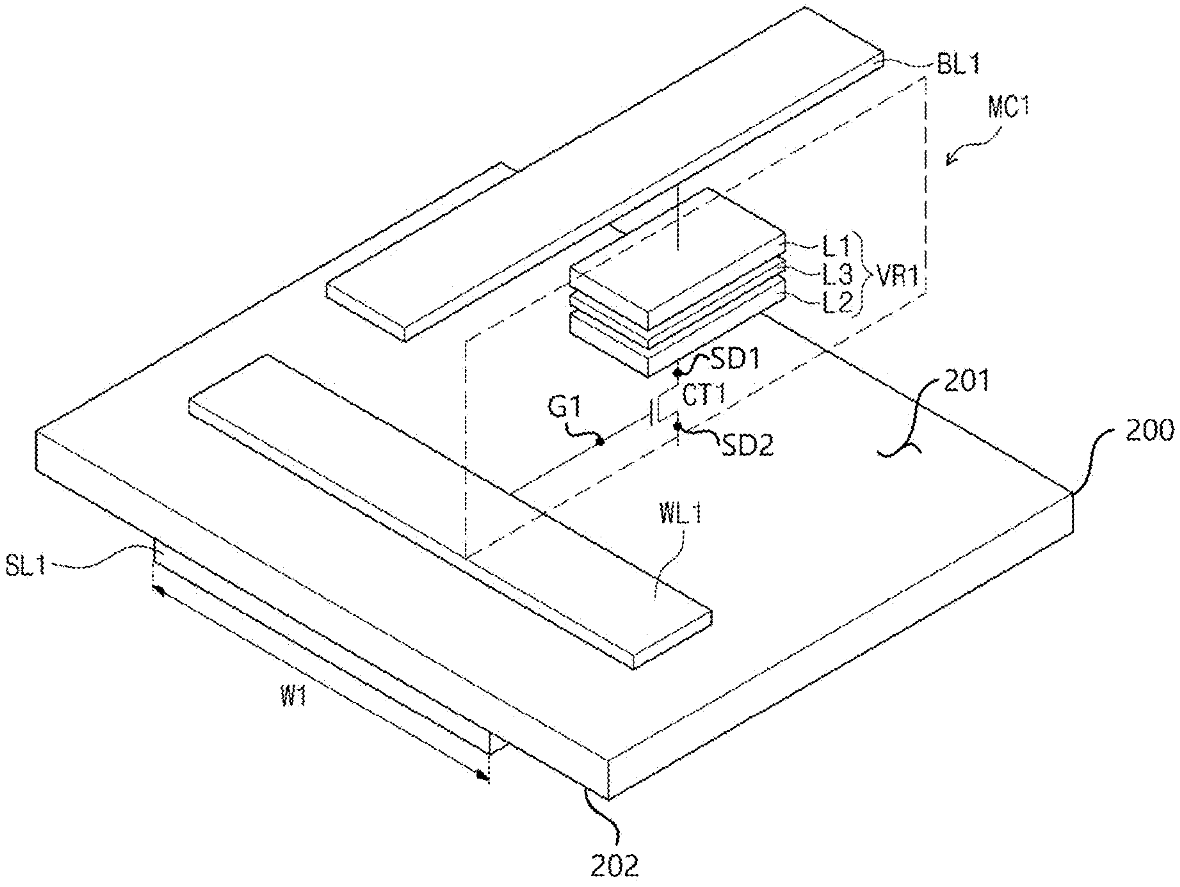

【FIG. 3A】
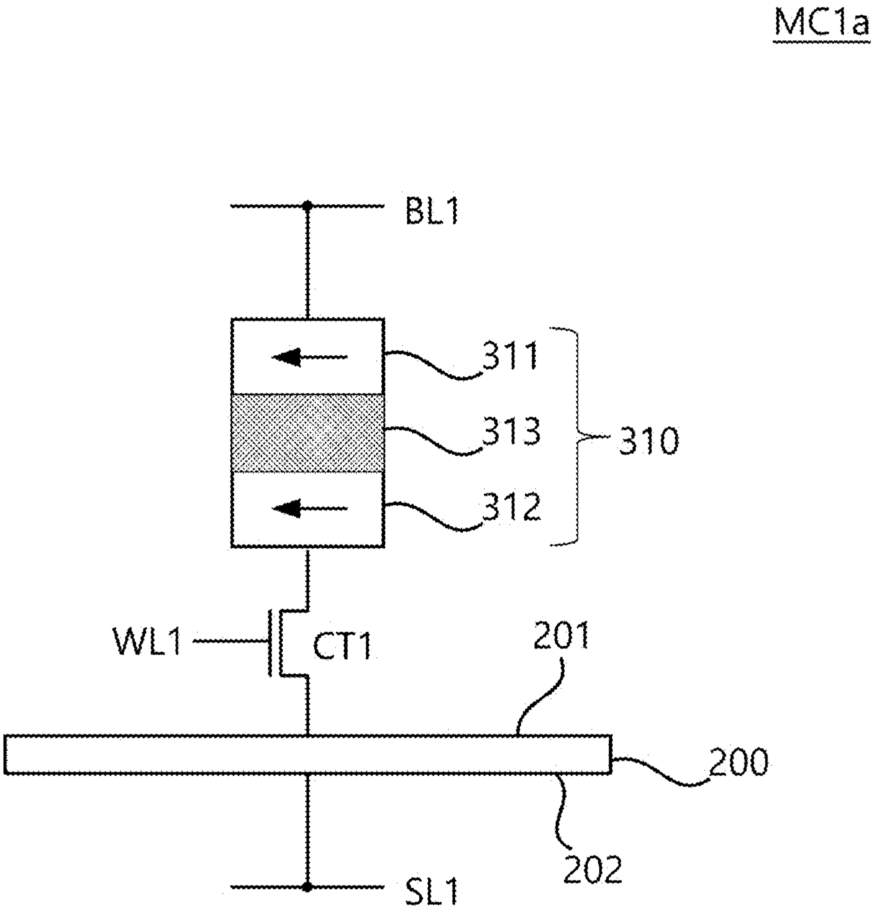

【FIG. 3B】
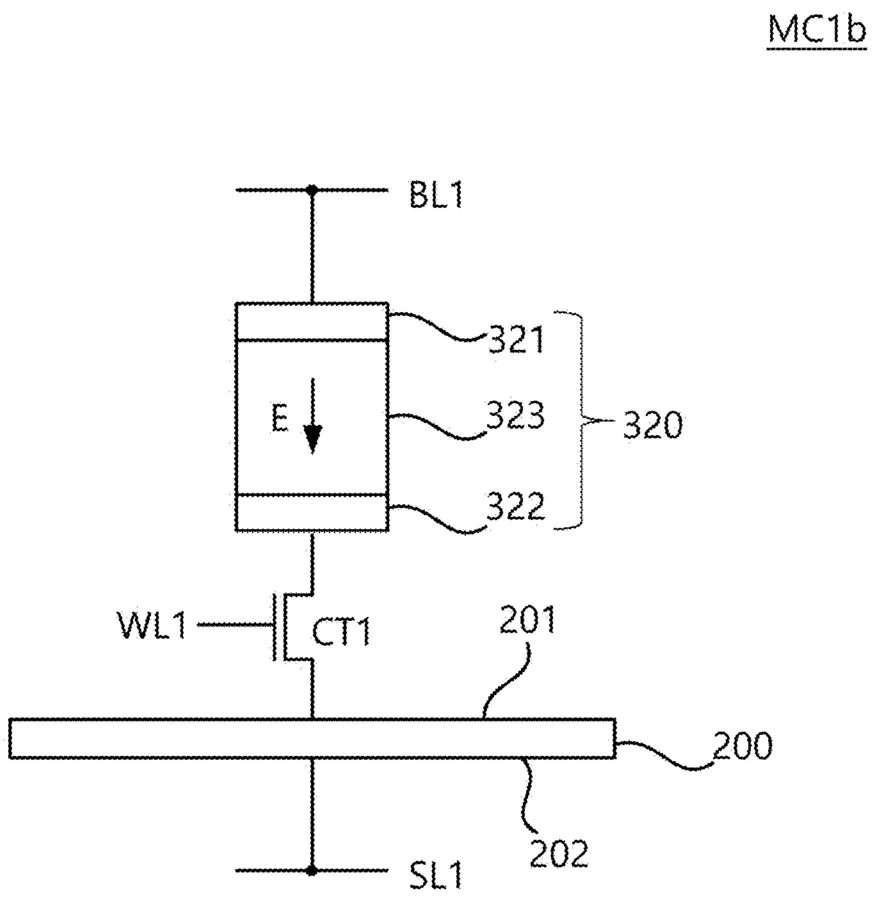

【FIG. 4A】
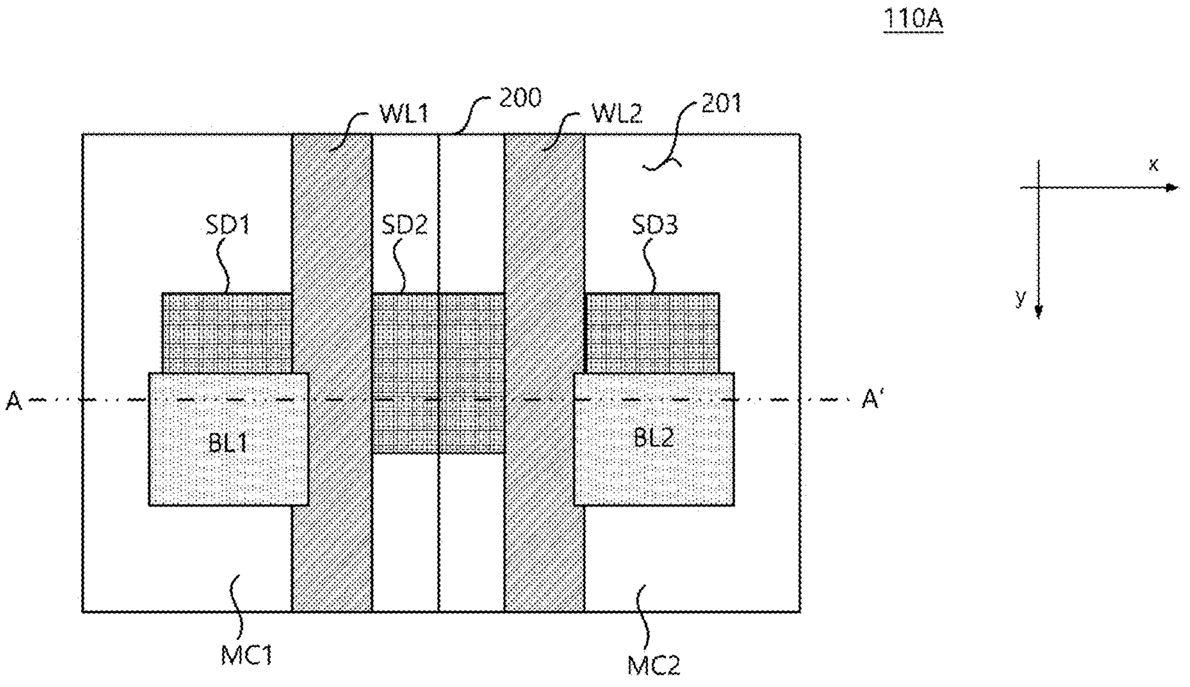

【FIG. 4B】
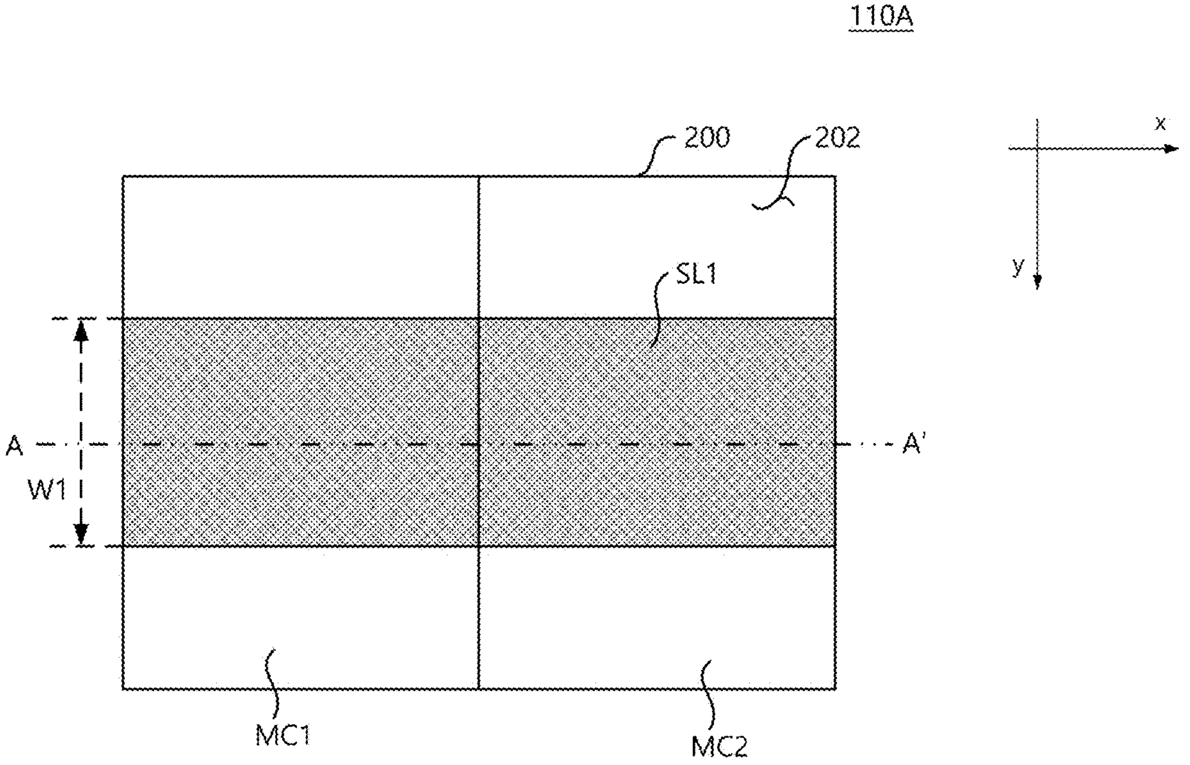

【FIG. 4C】
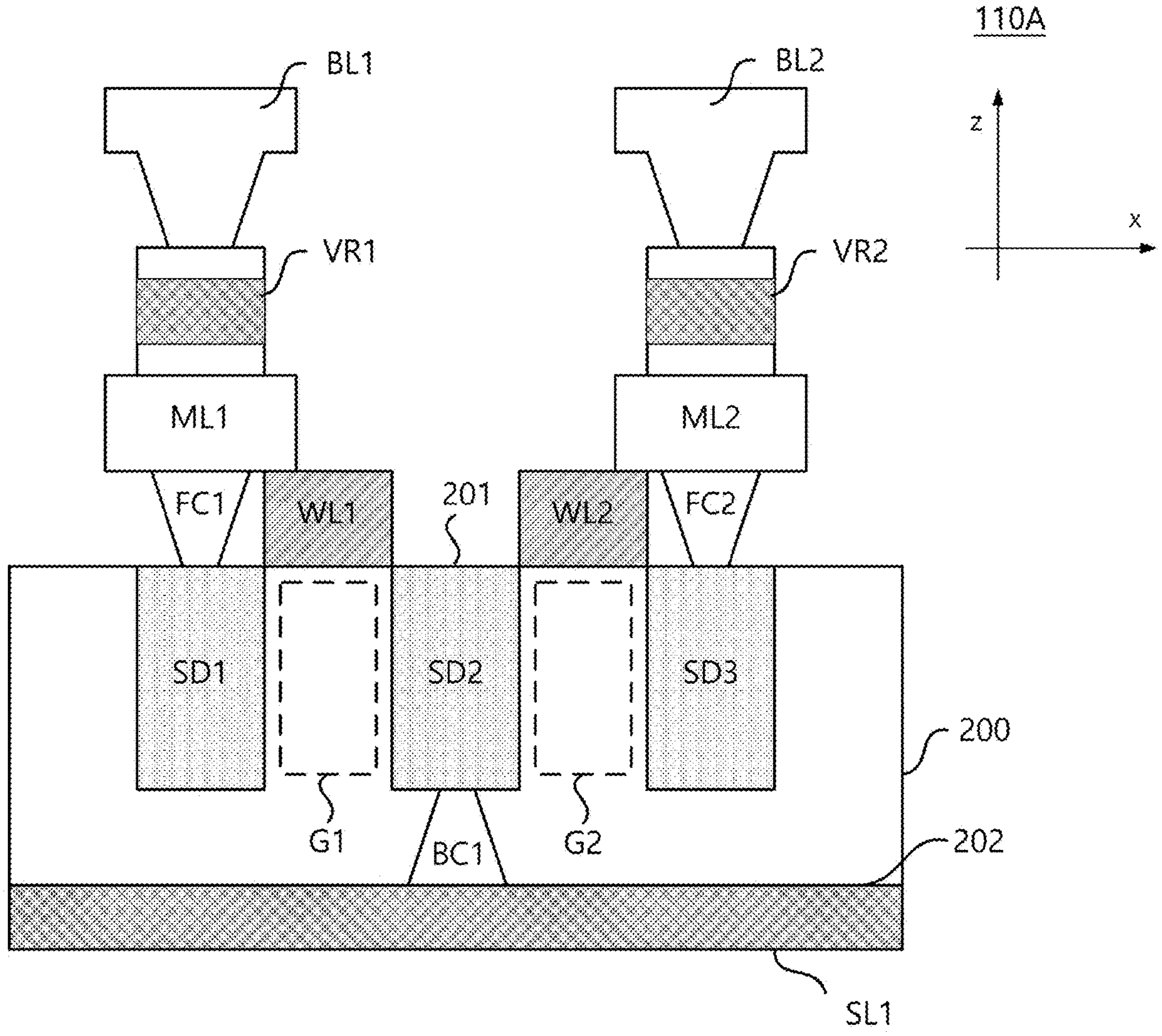

【FIG. 5A】
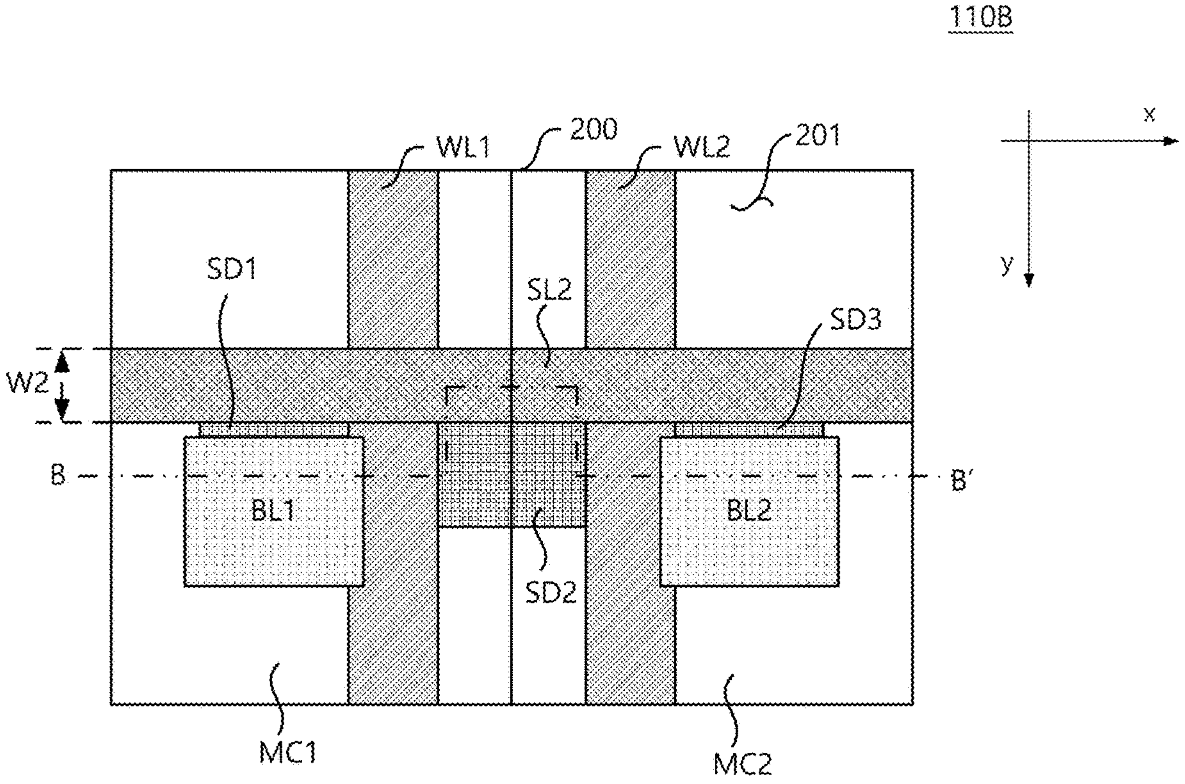

【FIG. 5B】
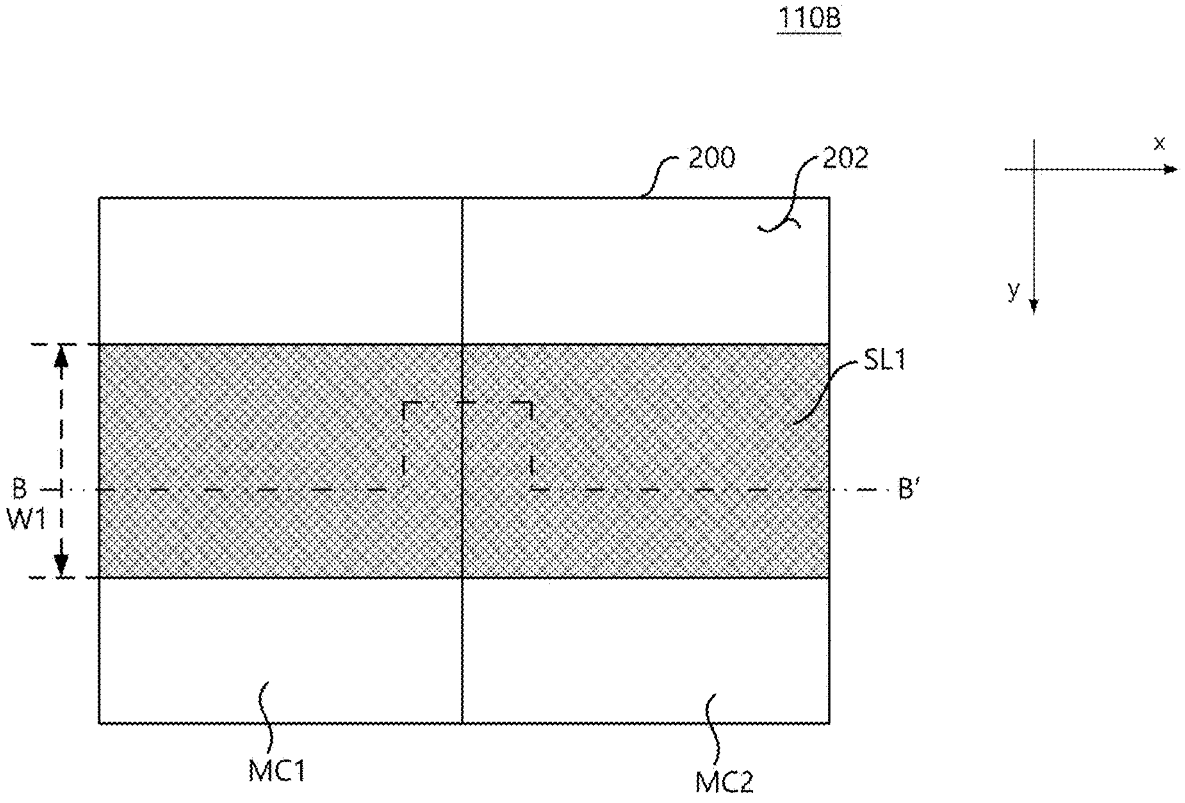

【FIG. 5C】
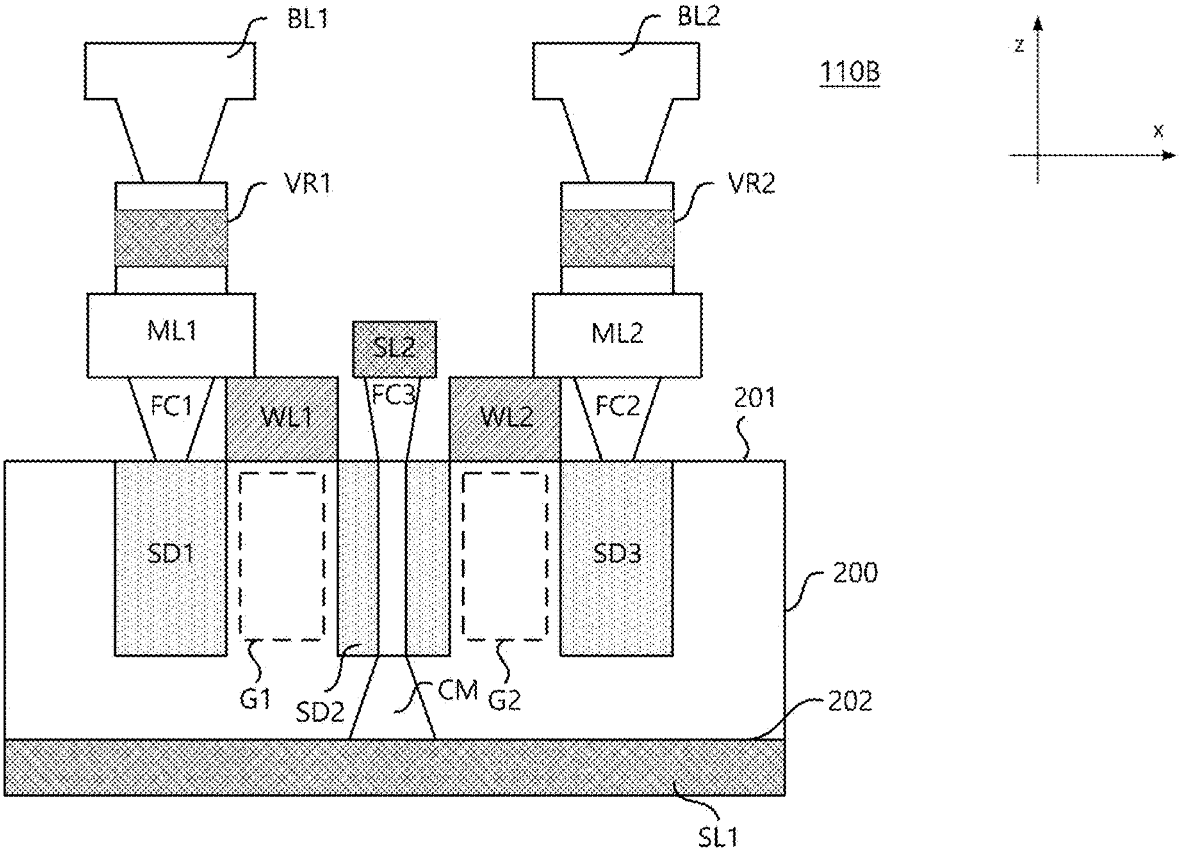

【FIG. 6A】
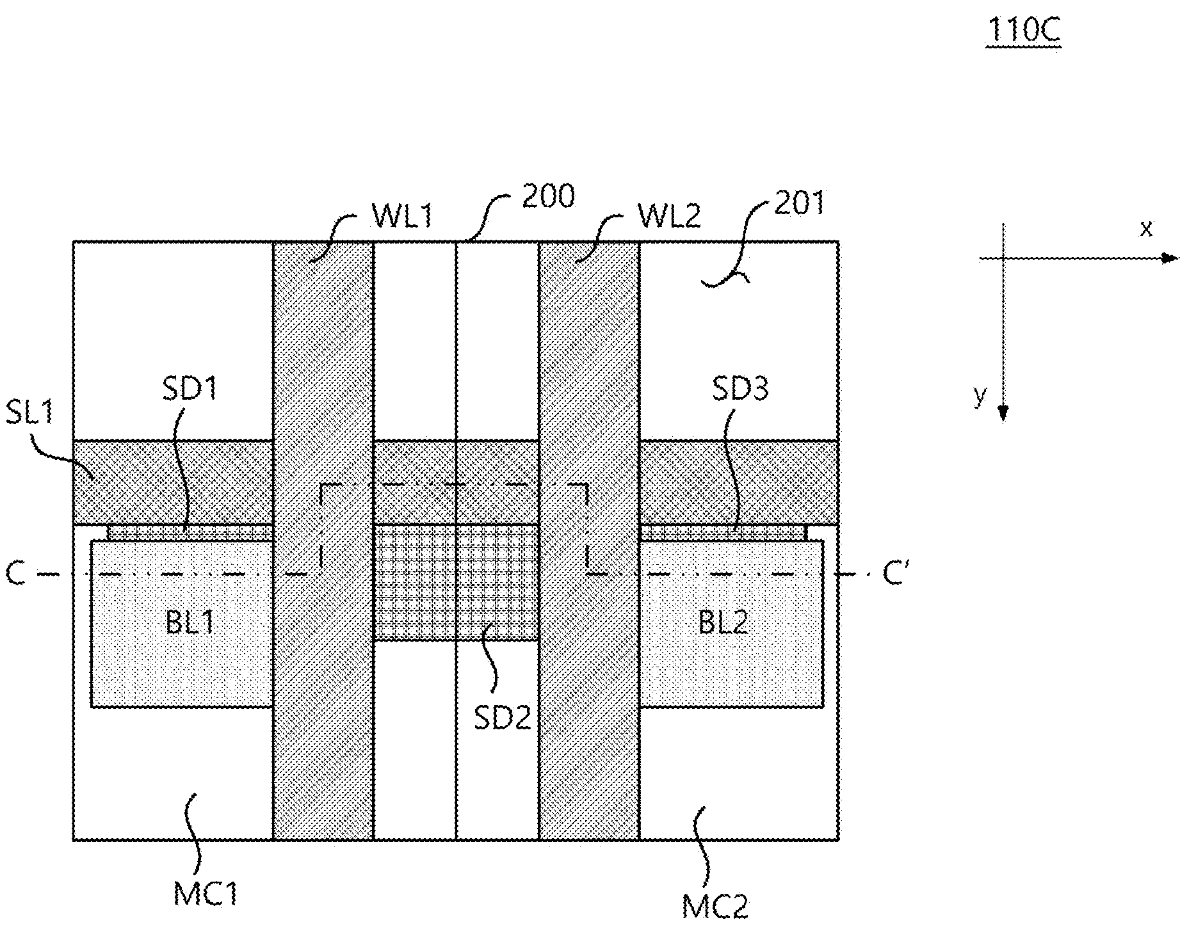

【FIG. 6B】
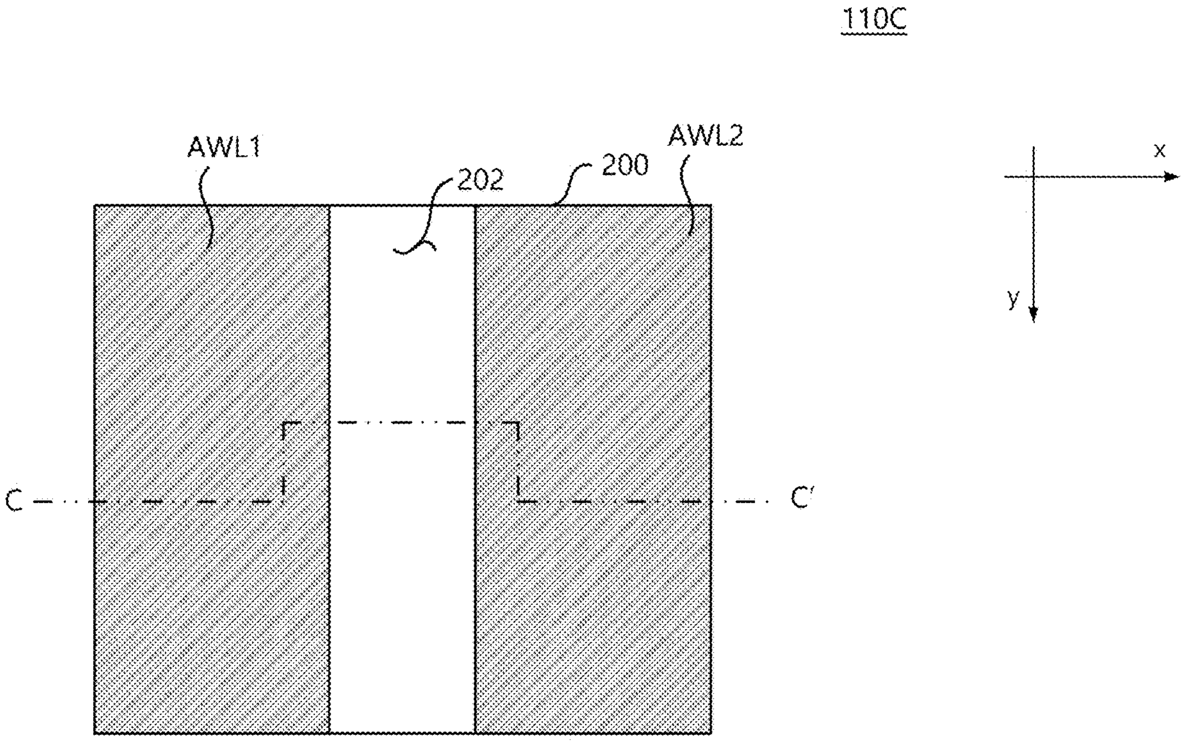

【FIG. 6C】
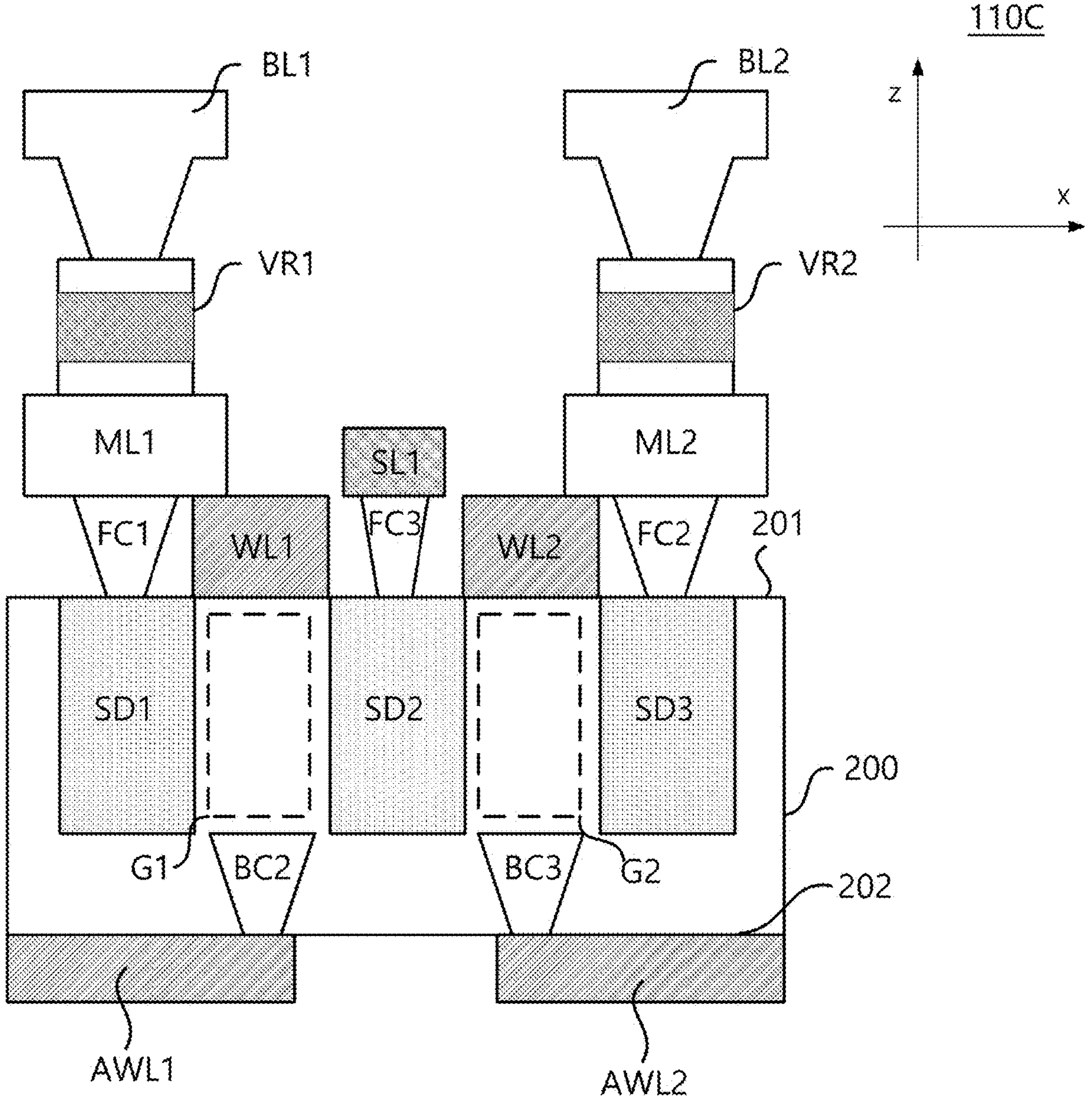

【FIG. 7A】
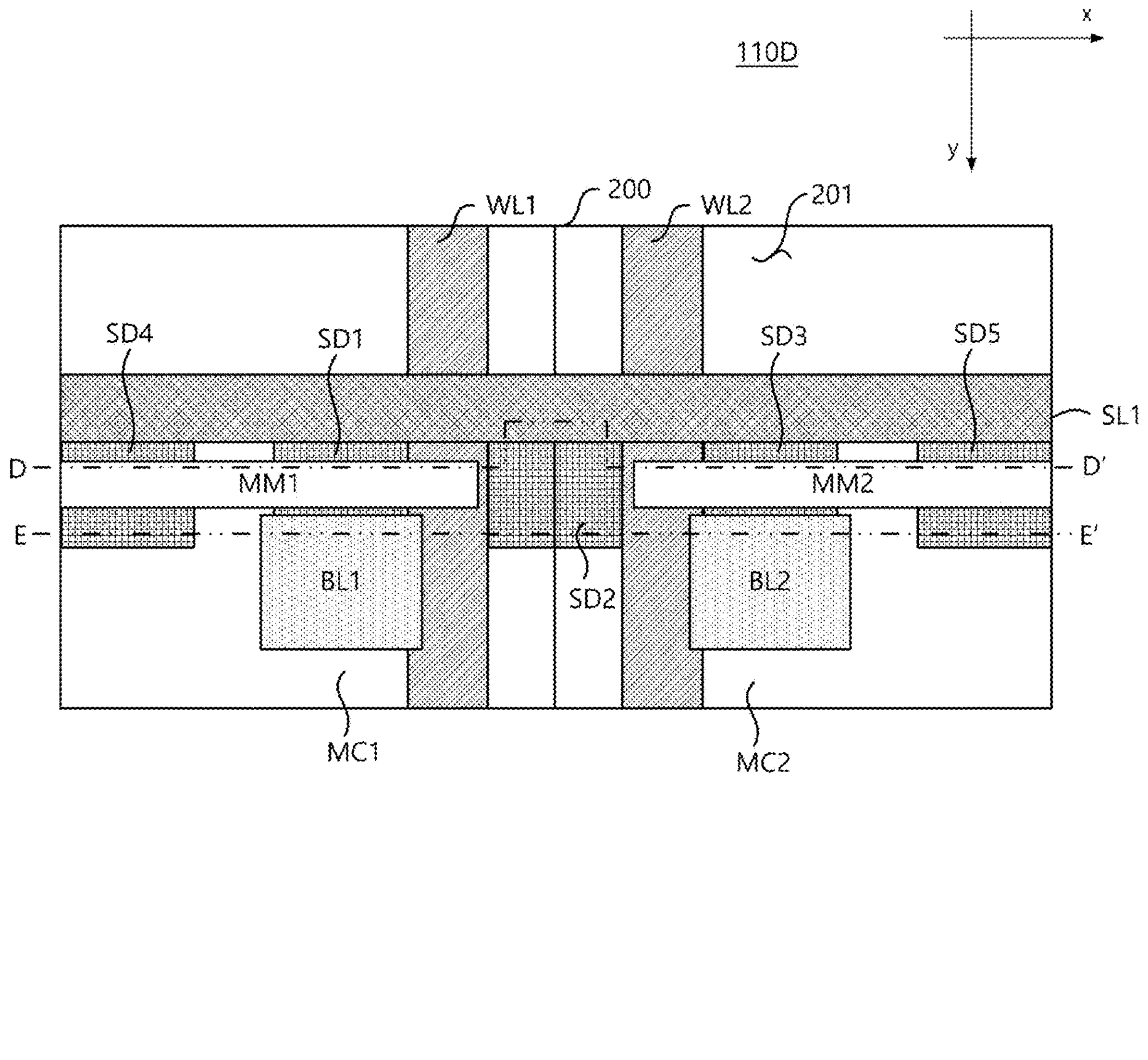

【FIG. 7B】
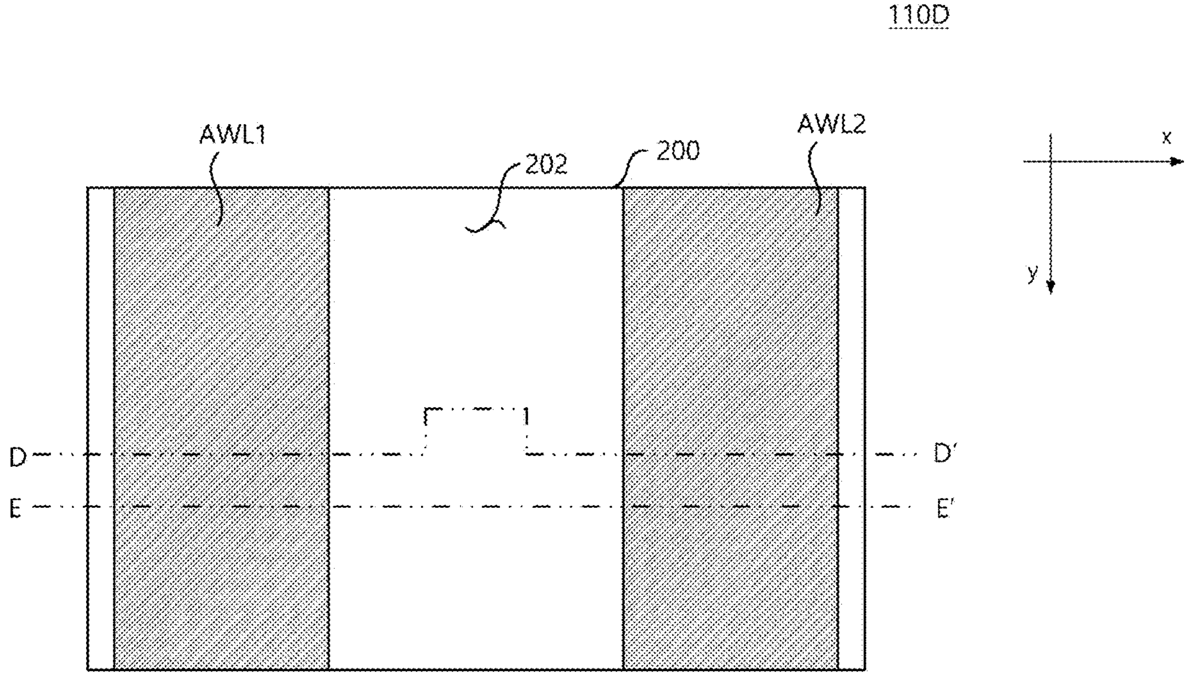

【FIG. 7C】
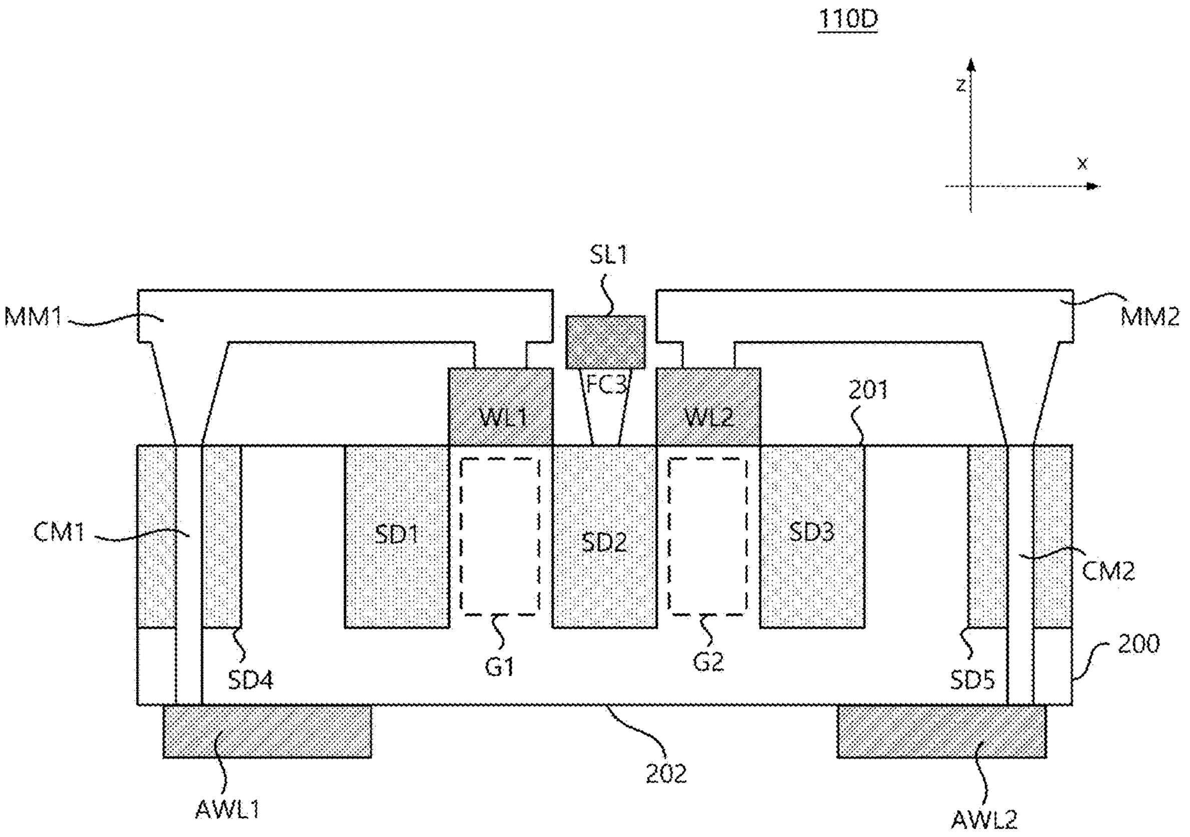

【FIG. 7D】
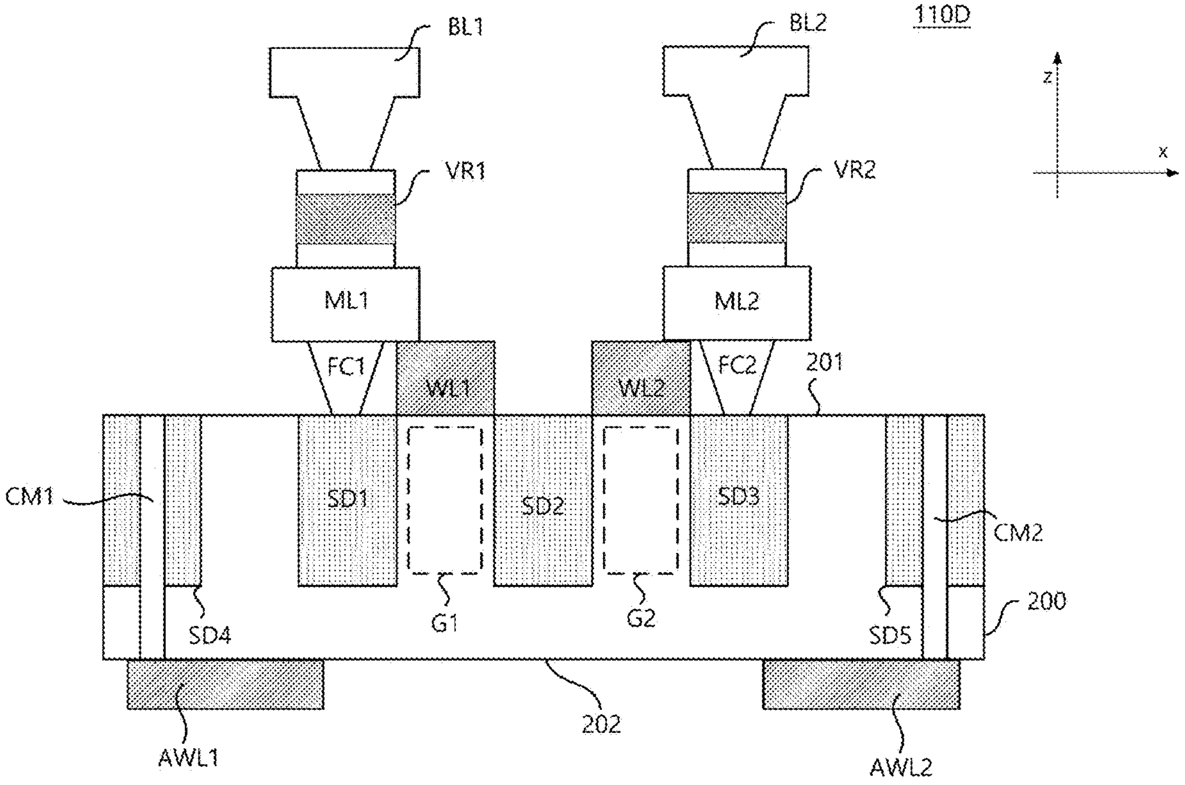

【FIG. 8A】
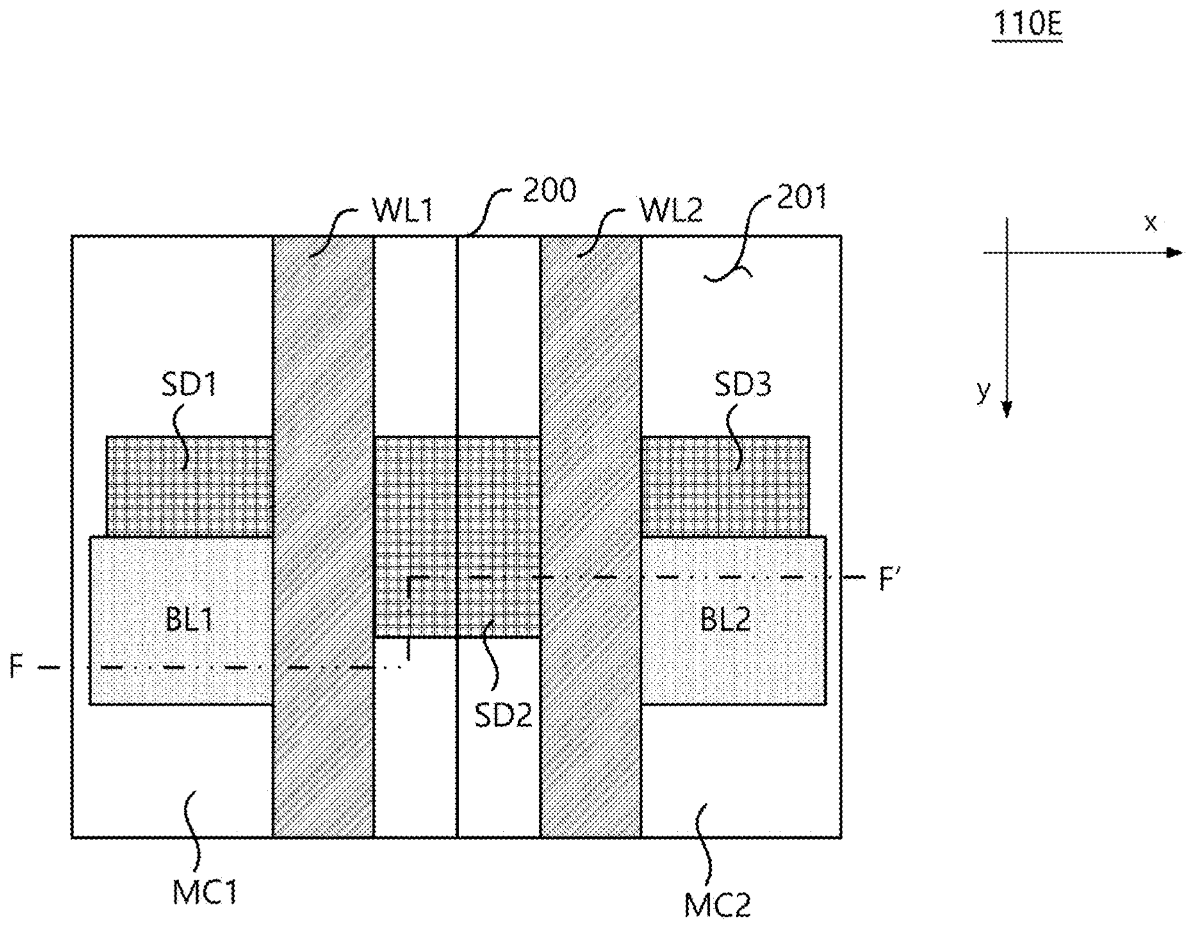

【FIG. 8B】
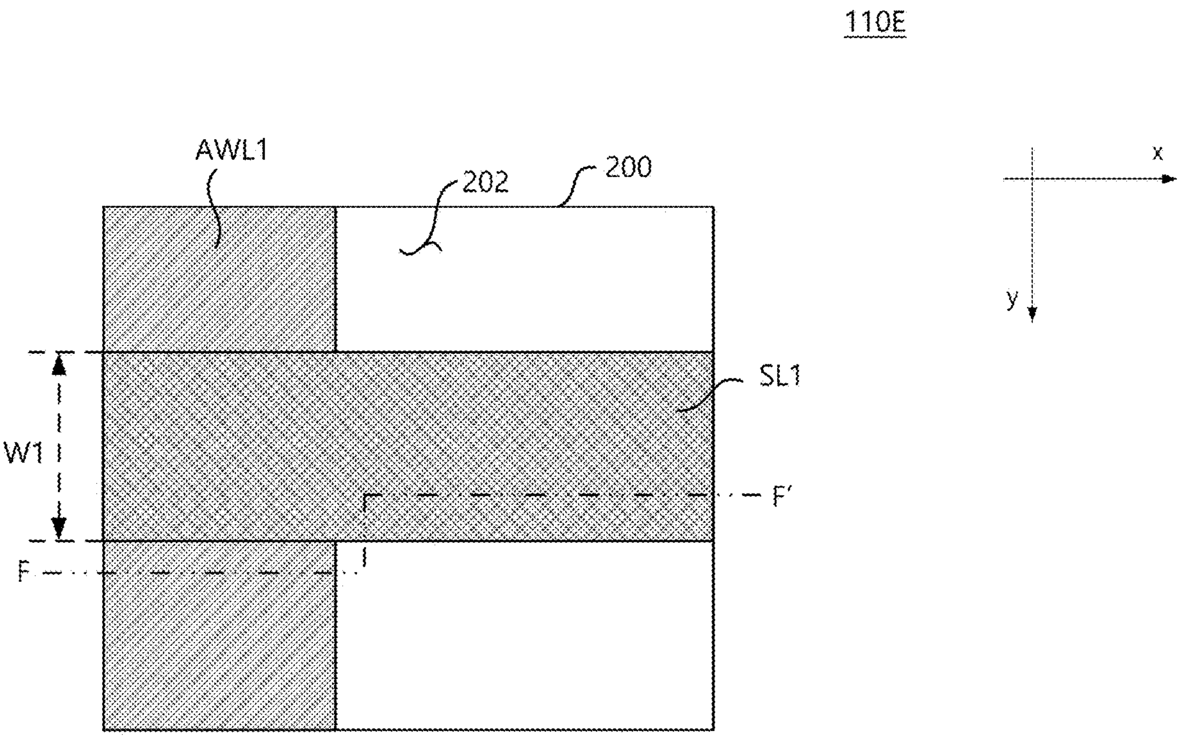

【FIG. 8C】
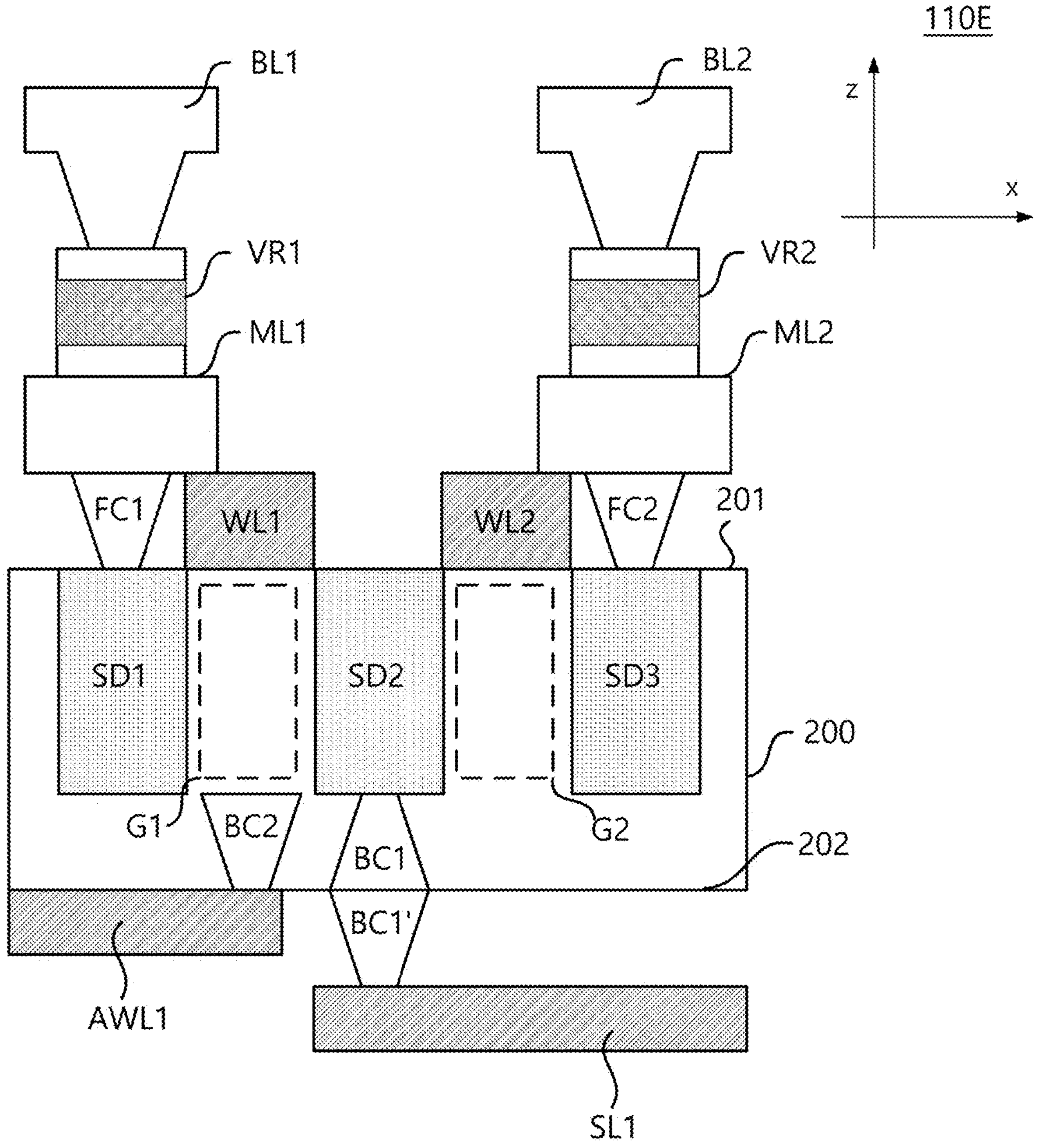

【FIG. 9】
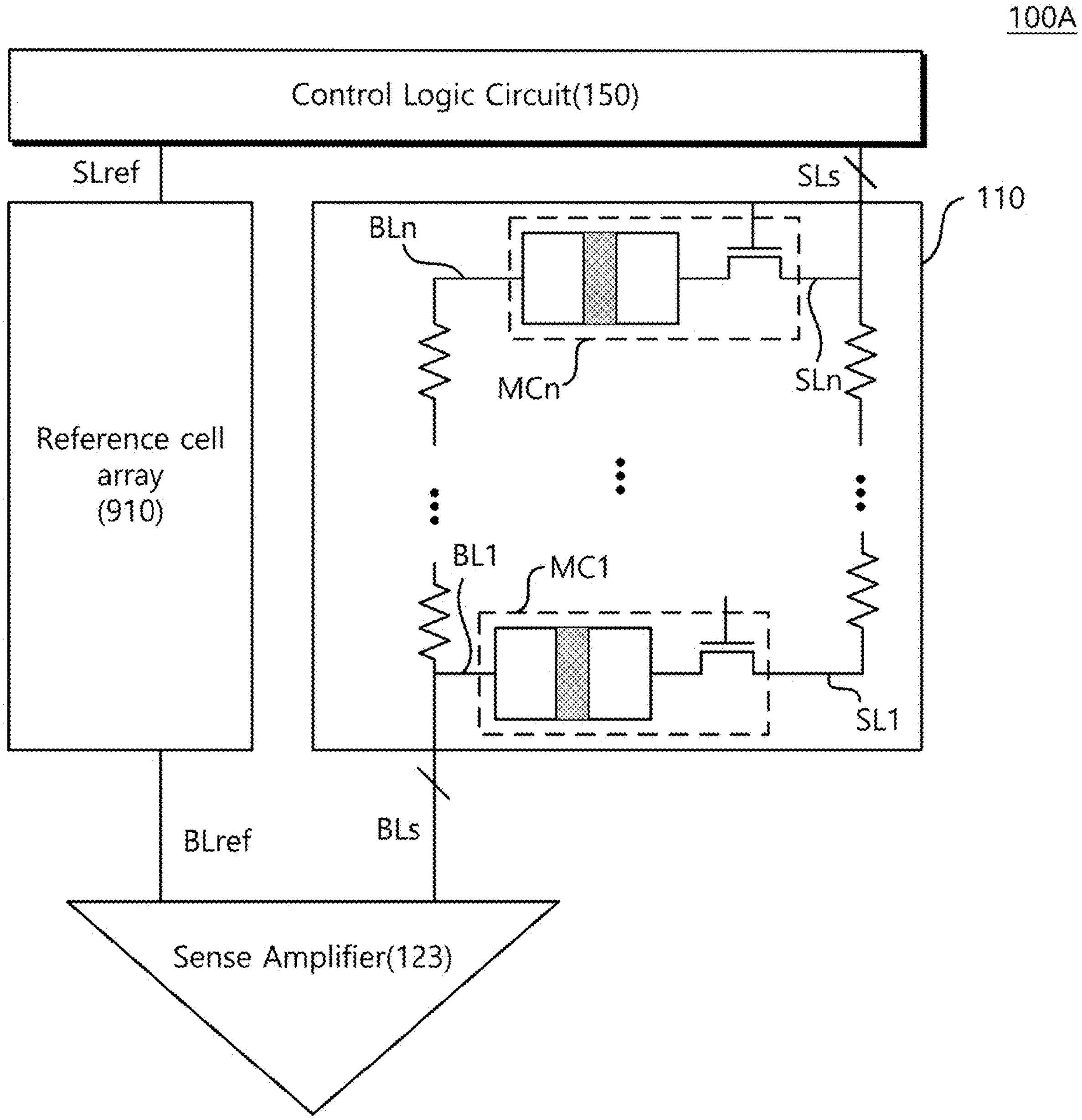

SEMICONDUCTOR MEMORY DEVICE INCLUDING MEMORY CELLS

CROSS-REFERENCE TO RELATED APPLICATION(S)

This U.S. non-provisional application claims priority under 35 USC § 119 to Korean Patent Application No. 10-2024-0003866, filed on Jan. 9, 2024, in the Korean Intellectual Property Office, the disclosure of which is incorporated by reference in its entirety herein.

1. TECHNICAL FIELD

Example embodiments are directed to a semiconductor memory device, and more particularly, to a nonvolatile semiconductor memory device configured to reduce read margin errors.

2. DISCUSSION OF RELATED ART

A nonvolatile semiconductor memory device retains stored data even when not powered. Examples of the non-volatile semiconductor memory device include a magnetic random access memory (MRAM) and a resistive random access memory.

The MRAM stores data in a memory cell using a change in resistance of a magnetic tunnel junction (MTJ) element. The resistance of the MTJ element varies depending on whether a magnetization direction of a free layer is the same as that of a pinned layer.

The RRAM stores data using a resistance change caused by the movement of oxygen vacancies. An RRAM may have different resistances depending on the characteristics of a resistance change caused by a change of a magnetic field formed in an insulating layer disposed between two metal layers.

Recently, with the increasing demand for miniaturization, high integration, and the development of fine processes for semiconductor memory devices, the size (or width) of metal lines for a read or write operation of a memory device is also decreasing.

However, in a structure of a memory cell, the resistance of a metal line is increased as a size of the metal line is decreased. The increased resistance may reduce a read margin for a memory device. In addition, when the resistance of the metal line is increased, a mismatch in the read margin may occur between memory cells close to a sense amplifier and memory cells distant from the sense amplifier. Thus, a read operation may not be performed normally.

SUMMARY

Example embodiments provide a semiconductor memory device for significantly reducing the resistance of metal lines in memory cell arrays and effects caused by the resistance of the metal lines.

According to an example embodiment, a semiconductor memory device includes a first memory cell, a substrate, a first bitline, and a first source line. The first memory cell includes a first variable resistor element and a first cell transistor connected to the first variable resistor element through a first source-drain electrode. The substrate includes a first surface connected to the second source-drain electrode of the first cell transistor and a second surface that opposes the first surface. The first bitline is connected to the first source-drain electrode of the first cell transistor through the first variable resistor element. The first source line is disposed on the second surface of the substrate to have a first width and is connected to the second source-drain electrode.

According to an example embodiment, a semiconductor memory device includes a memory cell array, a first bitline, a first source line and a substrate. The memory cell array includes a plurality of memory cells, each including a variable resistor element and a cell transistor. The first bitline and the first source line are connected to a first memory cell, among the plurality of memory cells. The substrate is connected between the first memory cell and the first source line. The substrate includes a first surface adjacent a first cell transistor and a second surface opposing the first surface. The first bitline is connected to the first cell transistor through a first variable resistor element of the first memory cell. The first source line is disposed on the second surface of the substrate and is connected to the first cell transistor.

According to an example embodiment, a semiconductor memory device includes a first memory cell, a substrate, a first bitline, a first wordline and a first additional wordline. The first memory cell includes a first variable resistor element and a first cell transistor connected to the first variable resistor element through a first source-drain electrode. The substrate includes a first surface connected to a second source-drain electrode of the first cell transistor and a second surface opposing the first surface. The first bitline is connected to the first source-drain electrode of the first cell transistor through the first variable resistor element. The first wordline is disposed on the first surface to connect to a first gate electrode of the first cell transistor. The first additional wordline is disposed on the second surface of the substrate and connected to the first gate electrode.

BRIEF DESCRIPTION OF DRAWINGS

The above and other aspects and features of the present disclosure will be more clearly understood from the following detailed description, taken in conjunction with the accompanying drawings.

FIG. 1 is a block diagram of a semiconductor memory device according to an example embodiment.

FIG. 2 is a diagram illustrating a configuration of a first memory cell included in a memory cell array according to an example embodiment.

FIG. 3A is a diagram illustrating a first memory cell including a first variable resistor element according to an example embodiment.

FIG. 3B is a diagram illustrating a first memory cell including a first variable resistor element according to an example embodiment.

FIG. 4A is a plan view illustrating a first surface of a substrate, on which a plurality of metal lines are disposed, according to an example embodiment.

FIG. 4B is a bottom view illustrating a second surface of the substrate of FIG. 4A on which a first source line is disposed.

FIG. 4C is a cross-sectional view of the substrate of FIGS. 4A and 4B, taken along line A-A'.

FIG. 5A is a plan view illustrating a first surface of a substrate, on which a plurality of metal lines are disposed, according to an example embodiment.

FIG. 5B is a bottom view illustrating a second surface of the substrate of FIG. 5A on which a first source line is disposed.

FIG. 5C is a cross-sectional view of the substrate of FIGS. 5A and 5B, taken along line B-B'.

FIG. 6A is a plan view illustrating a first surface of a substrate, on which a plurality of metal lines are disposed, according to an example embodiment.

FIG. 6B is a bottom view illustrating a second surface of the substrate of FIG. 6A on which a first additional wordline and a second additional wordline are disposed.

FIG. 6C is a cross-sectional view of the substrate of FIGS. 6A and 6B, taken along line C-C'.

FIG. 7A is a plan view illustrating a first surface of a substrate, on which a plurality of metal lines are disposed, according to an example embodiment.

FIG. 7B is a bottom view illustrating a second surface of the substrate of FIG. 7A on which a first additional wordline and a second additional wordline are disposed.

FIG. 7C is a cross-sectional view of the substrate of FIGS. 7A and 7B, taken along line D-D'.

FIG. 7D is a cross-sectional view of the substrate in FIGS. 7A and 7B, taken along line E-E'.

FIG. 8A is a plan view illustrating a first surface of a substrate, on which a plurality of metal lines are disposed, according to an example embodiment.

FIG. 8B is a bottom view illustrating a second surface of the substrate of FIG. 8A on which a first additional wordline and a first source line are disposed.

FIG. 8C is a cross-sectional view of the substrate of FIGS. 8A and 8B, taken along line F-F'.

FIG. 9 is a circuit diagram illustrating a configuration in which a control logic circuit according to an example embodiment reads data, stored in a memory cell array, using a sense amplifier.

DETAILED DESCRIPTION

Hereinafter, example embodiments will be described with reference to the accompanying drawings.

FIG. 1 is a block diagram of a semiconductor memory device according to an example embodiment. FIG. 2 is a diagram illustrating a configuration of a first memory cell included in a memory cell array according to an example embodiment.

Referring to FIG. 1, a semiconductor memory device 100 according to an example embodiment includes a memory cell array 110, a row decoder 121 (e.g., a first decoder circuit), a column decoder 122 (e.g., a second decoder circuit), and a control logic circuit 150.

According to an example embodiment, the semiconductor memory device 100 includes a memory cell array 110 including a plurality of memory cells MC1 to MCn.

For example, the memory cell array 110 may include a plurality of memory cells MC1, MC2 to MCn disposed in a matrix of rows and columns. Each of the plurality of memory cells MC1, MC2 to MCn may be connected to a plurality of wordlines WL1 to WLn, a plurality of bitlines BL1 to BLn, and a plurality of source lines SL1 to SLn (where n is a positive integer).

According to an example embodiment, the memory cell array 110 includes nonvolatile memory cells.

For example, the memory cell array 110 may include a plurality of memory cells MC1 to MCn, which are resistive memory cells such as phase change random access memory (PRAM) cells or resistance RAM (RRAM) cells, nano floating gate memory (NFGM) cells, polymer RAM (PoRAM) cells, magnetic RAM (MRAM) cells, or ferro-electric RAM (FRAM) cells.

In addition, according to an example embodiment, the memory cell array 110 may include spin transfer torque magneto resistive RAM (STT-MRAM) cells.

In the following, an example will be provided in which the memory cell array 110 includes memory cells including an STT-MRAM or an RRAM.

At least a portion of the plurality of memory cells MC1, MC2 to MCn may be selected by a row address XADD and a column address YADD.

For example, at least one wordline may be selected by the row address XADD. In addition, at least one bitline and at least one source line may be selected by the column address YADD.

For example, among the plurality of memory cells MC1, MC2 to MCn, a memory cell connected to a wordline selected by the row address XADD and a bitline and a source line selected by the column address YADD may be selected.

According to an example embodiment, the semiconductor memory device 100 includes the row decoder 121 selecting at least a portion of the plurality of wordlines WL1 to WLn.

For example, the row decoder 121 may decode the row address XADD to activate a corresponding wordline, among the wordlines WL1 to WLn.

In addition, the semiconductor memory device 100 may include the column decoder 122 that selects at least a portion of the plurality of bitlines BL1 to BLn and the plurality of source lines SL1 to SLn that correspond to each other.

In addition, the semiconductor memory device 100 may include the control logic circuit 150 connected to the row decoder 121 and the column decoder 122.

The control logic circuit 150 according to an example embodiment may receive a command, an address, or write data from a processor or memory controller. The control logic circuit 150 may generate various control signals (for example, a row address XADD and a column address YADD) used for an access operation to the memory cell array 110, such as program operations or read operations, in response to the command and the address.

For example, the control logic circuit 150 may execute software (or programs) to control at least one other component (for example, the row decoder 121 or the column decoder 122 of the semiconductor memory device 100) and perform various data processing or operations. The control logic circuit 150 may include a central processing unit or a microprocessor, and may control the overall operation of the semiconductor memory device 100. Therefore, it may be understood that the operations performed by the semiconductor memory device 100 are performed under the control of the control logic circuit 150.

According to an example embodiment, the control logic circuit 150 includes an algorithm for controlling at least a portion of the row decoder 121 and the column decoder 122. For example, the algorithm may be software code programmed in the control logic circuit 150. For example, the algorithm may be hard-coded in the control logic circuit 150, but example embodiments are not limited thereto.

According to the algorithm, the control logic circuit 150 may store data in each of the plurality of memory cells MC1, MC2 to MCn or read the data stored in each of the plurality of memory cells MC1, MC2 to MCn.

According to an example embodiment, the control logic circuit 150 may apply write current to a memory cell, selected through the row decoder 121 and the column decoder 122, to store data.

In addition, the control logic circuit 150 may apply read current to a memory cell, selected through the row decoder 121 and the column decoder 122, to read the data stored in the selected memory cell.

For example, the control logic circuit 150 may determine a resistance value of at least a portion of the memory cells included in the memory cell array 110.

In addition, the control logic circuit 150 may read data stored in a memory cell based on the determined resistance value.

The plurality of memory cells MC1, MC2 to MCn included in the memory cell array 110 may have different resistance values depending on the applied current or voltage. In addition, the plurality of memory cells MC1, MC2 to MCn may store different data depending on the resistance value.

Accordingly, each of the plurality of memory cells MC1 to MCn included in the memory cell array 110 according to example embodiments may be referred to as a resistive memory cell. In addition, the semiconductor memory device 100 according to example embodiments may be referred to as a resistive memory device.

Referring to FIG. 2, a semiconductor memory device 100 (or a memory cell array 110) according to an example embodiment may include a first memory cell MC1 and a substrate 200.

The first memory cell MC1 may be connected between a substrate 200 and a first bitline BL1. For example, the first memory cell MC1 may be connected between a first bitline BL1 and a first surface 201 of the substrate 200.

According to an example embodiment, the first memory cell MC1 includes a first variable resistor element VR1 connected to the first bitline BL1.

The first variable resistor element VR1 may include a plurality of layers L1, L2, and L3.

The first variable resistor element VR1 may be connected to the first bitline BL1 through a first surface of the first layer L1.

In addition, the first variable resistor element VR1 may have different resistance values depending on the current applied from at least a portion of the first bitline BL1, the first source line SL1, and the first wordline WL1.

According to an example embodiment, the control logic circuit 150 determines the data stored in the first variable resistor element VR1 based on the resistance value of the first variable resistor element VR1.

For example, the control logic circuit 150 may determine the data stored in the first variable resistor element VR1 based on a resistance value formed by at least a portion of the plurality of layers L1, L2, and L3.

For example, the control logic circuit 150 may read the data "1" when the first variable resistor element VR1 has a high resistance value (or a resistance value higher than a threshold) due to the current applied from at least a portion of the first bitline BL1, the first source line SL1, and the first wordline WL1.

For example, the control logic circuit 150 may read the data "0" when the first variable resistor element VR1 has a low resistance value (or resistance value lower than or equal to the threshold) due to the current applied from at least a portion of the first bitline BL1, the first source line SL1, and the first wordline WL1.

While this example describes how the control logic circuit 150 may determine the data stored in the first variable resistor element VR1 based on the resistance value of the first variable resistor element VR1, example embodiments are not limited thereto.

In addition, the first memory cell MC1 according to an example embodiment includes a first cell transistor CT1 connected between the first variable resistor element VR1 and the substrate 200.

For example, the first memory cell MC1 may include a first cell transistor CT1 connected between the first variable resistor element VR1 and the first surface 201 of the substrate 200.

A first source-drain electrode SD1 of the first cell transistor CT1 may be connected to the first variable resistor element VR1. For example, the first source-drain electrode SD1 of the first cell transistor CT1 may be connected to the first variable resistor element VR1 through one surface of the second layer L2.

For example, the first variable resistor element VR1 may be connected between the first bitline BL1 and the first source-drain electrode SD1 of the first cell transistor CT1. In addition, the first bitline BL1 may be connected to the first source-drain electrode SD1 of the first cell transistor CT1 through the first variable resistor element VR1.

A second source-drain electrode SD2 of the first cell transistor CT1 may be connected to the first surface 201 of the substrate 200.

In addition, the semiconductor memory device 100 according to an example embodiment may include a first source line SL1 disposed on a second surface 202 parallel to the first surface 201 of the substrate 200. For example, the semiconductor memory device 100 may include a first source line SL1 formed on the second surface 202 of the substrate 200 with a first width W1.

The second source-drain electrode SD2 of the first cell transistor CT1 may be connected to the first source line SL1 formed on the second surface 202 of the substrate 200.

In an embodiment, the second source-drain electrode SD2 is connected to the first source line SL1 formed on the second surface 202 of the substrate 200 through a back contact (or a conductive via) formed inwardly of the substrate 200 from the second surface 202.

In another embodiment, the second source-drain electrode SD2 is connected to the first source line SL1 formed on the second surface 202 of the substrate 200 through a back contact (or a conductive via) formed to penetrate through at least a portion of the substrate 200 from the second surface 202.

Accordingly, the first source line SL1 formed on the second surface 202 of the substrate 200 may be connected to the second source-drain electrode SD2 of the first cell transistor CT1. In addition, the first source line SL1 may be connected to the first variable resistor element VR1 through the first cell transistor CT1.

In addition, the first gate electrode G1 of the first cell transistor CT1 may be connected to the first wordline WL1.

According to an example embodiment, the first cell transistor CT1 may be controlled based on a voltage applied through a first gate electrode G1 from the first wordline WL1.

For example, the first cell transistor CT1 may be turned on or off based on the voltage applied from the first wordline WL1.

For example, the first wordline WL1 may be formed on the first surface 201. For example, the first wordline WL1 may be formed at a predetermined distance from the first surface 201.

Referring to the above-described configurations, a semiconductor memory device 100 according to an example embodiment may include a first memory cell MC1 and a first bitline BL1 disposed on the first surface 201 of the substrate 200.

In addition, the semiconductor memory device 100 may include a first source line SL1 disposed on the second surface 202, parallel to the first surface 201 of the substrate 200, to be connected to the first cell transistor CT1.

The first source line SL1 may have a relatively large area (or width) compared to the case in which it is formed on the first surface 201 together with the first memory cell MC1, the first wordline WL1, and the first bitline BL1.

Thus, the semiconductor memory device 100 according to an example embodiment may significantly reduce a resistance value of the first source line SL1.

In addition, referring to the above-described configurations, the first wordline WL1 and/or the first bitline BL1 may have a relatively large area (or width) compared to the case in which they are formed on the first surface 201 together with the first source line SL1.

Thus, the semiconductor memory device 100 according to an example embodiment may significantly reduce a resistance value of the first wordline WL1 and/or the first bitline BL1.

To sum up, the semiconductor memory device 100 may reduce the resistance value of the metal lines connected to the first memory cell MC1 through the first source line SL1 disposed on the second surface 202.

Due to the above-described configurations, the semiconductor memory device 100 may increase the power efficiency of the operation of reading the data stored in the first memory cell MC1.

For example, the semiconductor memory device 100 may reduce a read margin for the first memory cell MC1.

In addition, referring to the above-described configurations, the first memory cell MC1 may have a relatively small area compared to the case in which the first bitline BL1 and the first source line SL1 are formed together on the first surface 201.

As a result, the semiconductor memory device 100 according to an example embodiment may significantly reduce a size of the first memory cell MC1.

FIG. 3A is a diagram illustrating a first memory cell including a first variable resistor element according to an example embodiment, and FIG. 3B is a diagram illustrating a first memory cell including a first variable resistor element according to an example embodiment.

Referring to FIGS. 3A and 3B, a first memory cell MC1*a* or MC1*b* according to an example embodiment may include a first variable resistor element 310 or 320 having different resistance values depending on current applied from at least one of a first bitline BL1, a first source line SL1, and a first wordline WL1.

The first memory cells MC1*a* and MC1*b* and the first variable resistor elements 310 and 320 illustrated in FIGS. 3A and 3B may each be understood as an example of the first memory cell MC1 and the first variable resistor element VR1 illustrated in FIG. 2.

Referring to FIG. 3A, the first variable resistor element 310 may include a first magnetic layer 311 and a second magnetic layer 312. In addition, the first variable resistor element 310 may include a tunnel layer 313 disposed between the first magnetic layer 311 and the second magnetic layer 312.

In an embodiment, a magnetization direction of the second magnetic layer 312 is fixed. In addition, a magnetization direction of the first magnetic layer 311 may be parallel to or antiparallel to the magnetization direction of the second magnetic layer 312 depending on the conditions.

Therefore, for example, the first magnetic layer 311 may be referred to a free layer, and the second magnetic layer 312 may be referred to as a pinned layer.

During a read operation on the first memory cell MC1, the control logic circuit 150 may apply a logic high voltage to the first wordline WL1. The first cell transistor CT1 may be turned on in response to the logic high voltage applied to the first wordline WL1.

In addition, the control logic circuit 150 may apply a read current to the first source line SL1 in a direction of the first bitline BL1 to measure a resistance value of the first variable resistor element 310. The control logic circuit 150 may determine the data stored in the first variable resistor element 310, based on the measured resistance value.

For example, when the magnetization direction of the first magnetic layer 311 is parallel to the magnetization direction of the second magnetic layer 312, the first variable resistor element 310 may have a low resistance value. In an example embodiment, the control logic circuit 150 may read data "0" from the first variable resistor element 310 when the first variable resistor element 310 has the low resistance value.

For example, when the magnetization direction of the first magnetic layer 311 is antiparallel to the magnetization direction of the second magnetic layer 312, the first variable resistor element 310 may have a high resistance value. In an example embodiment, the control logic circuit 150 may read data "1" from the first variable resistor element 310 when the first variable resistor element 310 has the high resistance value.

Accordingly, in an example embodiment, the first variable resistor element 310 may be referred to as a magnetic tunnel junction (MTJ) element. In addition, the first memory cell MC1*a* may be referred to as an MRAM memory cell.

While the first magnetic layer 311 and the second magnetic layer 312 of the first variable resistor element 310 are illustrated in FIG. 3 as horizontal magnetic elements, but example embodiments are not limited thereto. For example, the first magnetic layer 311 and the second magnetic layer 312 may be implemented as vertical magnetic elements.

Referring to FIG. 3B, the first variable resistor element 320 may include a first metal layer 321 and a second metal layer 322. In addition, the first variable resistor element 320 may include an insulating layer 323 formed between the first metal layer 321 and the second metal layer 322.

The control logic circuit 150 may apply a voltage to the first bitline BL1. Thus, the control logic circuit 150 may generate a potential difference between the first bitline BL1 and the first source line SL1.

A potential difference may be generated between the first metal layer 321 and the second metal layer 322 by the potential difference between the first bitline BL1 and the first source line SL1.

In addition, the first variable resistor element 320 may have different resistance values depending on a magnetic field E formed in the insulating layer 323 by the potential difference between the first metal layer 321 and the second metal layer 322.

For example, when no conductive path is formed in the insulating layer 323 by the potential difference between the first metal layer 321 and the second metal layer 322, the first variable resistor element 320 may have a high resistance value. In an example embodiment, the control logic circuit 150 may read data "0" from the first variable resistor element 320 when the first variable resistor element 320 has the high resistance value.

For example, when a conductive path is formed in the insulating layer 323 by the potential difference between the first metal layer 321 and the second metal layer 322, the first variable resistor element 320 may have a low resistance value. In an example embodiment, the control logic circuit 150 may read data "1" from the first variable resistor element 320 when the first variable resistor element 320 has the low resistance value.

Accordingly, in an example embodiment, the first variable resistor element 320 may be referred to as a metal-insulator-metal (MIM) element. In addition, the first memory cell MC1*b* may be referred to as an RRAM memory cell.

Referring to the above-described configurations, the first memory cell MC1*a* or MC1*b* according to an example embodiment may be referred to as an MRAM memory cell or an RRAM memory cell including a resistive element.

In addition, according to an example embodiment, the first cell transistor CT1, the first variable resistor element 310 or 320, the first wordline WL1, and the first bitline BL1 may be disposed on a first surface 201 of the substrate 200.

For example, at least a portion of the first cell transistor CT1, the first variable resistor element 310 or 320, the first wordline WL1, and the first bitline BL1 may be disposed adjacent to the first surface 201 of the substrate 200.

In an embodiment, the first source line SL1 is disposed on the second surface 202 of the substrate 200, parallel to the first surface 201.

Accordingly, the first source line SL1 may have a relatively large width (or area) compared to the case in which it is formed together with the first memory cell MC1, the first wordline WL1, and the first bitline BL1 on the first surface 201 of the substrate 200.

Thus, the semiconductor memory device 100 according to an example embodiment may reduce the resistance value of the first source line SL1.

In addition, referring to the above-described configurations, the first wordline WL1 and/or the first bitline BL1 may have a relatively large width (or area) compared to the case in which it is formed together with the first source line SL1 on the first surface 201 of the substrate 200.

Thus, the semiconductor memory device 100 according to an example embodiment may significantly reduce the resistance value of the first wordline WL1 and/or the first bitline BL1.

Accordingly, due to the above-described configurations, the semiconductor memory device 100 may increase the power efficiency of the operation of reading the data stored in the first memory cell MC1*a* or MC1*b*.

For example, the semiconductor memory device 100 may reduce a read margin for the first memory cell MC1*a* or MC1*b*.

FIG. 4A is a plan view illustrating a first surface of a substrate, on which a plurality of metal lines are disposed, according to an example embodiment. FIG. 4B is a bottom view illustrating a second surface of the substrate of FIG. 4A on which a first source line is disposed. FIG. 4C is a cross-sectional view of the substrate of FIGS. 4A and 4B, taken along line A-A'.

Referring to FIGS. 4A to 4C, a memory cell array 110A according to an example embodiment includes a first memory cell MC1 and a second memory cell MC2 disposed adjacent to each other.

The memory cell array 110A and the first memory cell MC1 illustrated in FIGS. 4A to 4C may be understood as examples of the memory cell array 110 and the first memory cell MC1 illustrated in FIG. 2.

Therefore, the same or substantially the same components are represented by the same reference numerals, and redundant descriptions thereof will be omitted.

Referring to FIG. 4A, a memory cell array 110A according to an example embodiment includes a second memory cell MC2 disposed adjacent to the first memory cell MC1.

For example, the memory cell array 110A may include a second memory cell MC2 disposed adjacent to the first memory cell MC1 in a first direction (for example, a positive X-direction).

According to an example embodiment, a first bitline BL1, a second bitline BL2, a first wordline WL1, and a second wordline WL2 are formed on a first surface 201 of a substrate 200.

For example, each of the first wordline WL1 and the second wordline WL2 may be formed to extend in a second direction (for example, a positive Y-direction), perpendicular to the first direction (for example, the positive X-direction) on the first surface 201 of the substrate 200. For example, the first bitline BL1 may overlap the first source-drain electrode SD1 and the first wordline WL1; and the second bitline BL2 may overlap the second source-drain electrode SD2 and the second wordline WL2.

For example, the first bitline BL1 and the second bitline BL2 may be formed to extend in the first direction (for example, the positive X-direction).

However, shapes and arrangement of the first bitline BL1, the second bitline BL2, the first wordline WL1, and the second wordline WL2 are not limited to the above examples.

In addition, the first source-drain electrode SD1 to the third source-drain electrode SD3 may be formed through at least a portion of the surface and interior of the substrate 200. For example, the first source-drain electrode SD1 to the third source-drain electrode SD3 may be formed to extend inwardly of the substrate 200 from the first surface 201 of the substrate 200. For example, the first source-drain electrode SD1 to the third source-drain electrode SD3 may be located inside the substrate 200 and contact the first surface 201.

Referring to FIG. 4B, a first source line SL1 according to an example embodiment is disposed on a second surface 202 of the substrate 200. For example, the second surface 202 may oppose the first surface 201.

For example, the first source line SL1 may be formed on the second surface 202 of the substrate 200 to have a first width W1 and extend in a first direction (for example, a positive X-direction). The first width W1 may be arranged in a second direction (for example, a Y-direction).

In an embodiment, the first source line SL1 is formed to penetrate through a region corresponding to each of a first memory cell MC1 and a second memory cell MC2 on the second surface 202 of the substrate 200.

Referring to FIGS. 4A and 4B, the first source line SL1 according to an example embodiment is formed to overlap at least a portion of a first bitline BL1 and a second bitline BL2 when viewed from a third direction (for example, a positive Z-direction), perpendicular to the first direction (for example, the positive X-direction and a second direction (for example, a positive Y-direction).

Referring to FIG. 4C, a first memory cell MC1 according to an example embodiment includes a first variable resistor element VR1 connected to the first bitline BL1. The variable resistor element VR1 may be a variable resistor or a potentiometer.

The memory cell array 110A may include a first front contact FC1 disposed on a first surface 201 of the substrate 200. The first front contact FC1 may be a conductor or include a conductive material. In addition, the memory cell array 110A may include a first metal line ML1 stacked on the first front contact FC1.

According to an example embodiment, the first variable resistor element VR1 is disposed on a first metal line ML1. Therefore, the first variable resistor element VR1 may be connected to the first source-drain electrode SD1 through the first metal line ML1 and the first front contact FC1.

Referring to FIG. 4C, a first memory cell MC1 according to an example embodiment includes a first variable resistor element VR1 connected to the first bitline BL1.

The memory cell array 110A may include a first front contact FC1 disposed on a first surface 201 of the substrate 200. In addition, the memory cell array 110A may include a first metal line ML1 stacked on the first front contact FC1.

According to an example embodiment, the first variable resistor element VR1 is disposed on a first metal line ML1. Therefore, the first variable resistor element VR1 may be connected to the first source-drain electrode SD1 through the first metal line ML1 and the first front contact FC1.

According to an example embodiment, at least a portion of the first metal line ML1 and the first front contact FC1 are omitted. Therefore, the first variable resistor element VR1 may be connected to the first source-drain electrode SD1 through at least a portion of the first metal line ML1 and the first front contact FC1.

In addition, the first bitline BL1 may be connected to the first source-drain electrode SD1 through the first variable resistor element VR1, the first metal line ML1, and the first front contact FC1.

For example, the first variable resistor element VR1 may be connected between the first bitline BL1 and the first source-drain electrode SD1.

Referring to FIGS. 2 and 4C, the first source-drain electrode SD1, the first gate electrode G1, and the second source-drain electrode SD2 may constitute a first cell transistor CT1.

A first gate electrode G1 of the first cell transistor CT1 may be connected to the first wordline WL1 disposed on the first surface 201 of the substrate 200.

In addition, the second source-drain electrode SD2 of the first cell transistor CT1 may be connected to the first source line SL1 disposed on the second surface 202 of the substrate 200.

In an embodiment, the second source-drain electrode SD2 of the first cell transistor CT1 is connected to the first source line SL1 through a first back contact BC1 penetrating through at least a portion of an interior of the substrate 200 via the second surface 202 of the substrate 200. The first back contact BC1 may be conductor or include a conductive material.

In addition, a second memory cell MC2 according to an example embodiment includes a second variable resistor element VR2 connected to the second bitline BL2. For example, the second variable resistor element VR2 may be a variable resistor or a potentiometer.

The memory cell array 110A may include a second front contact FC2 disposed on the first surface 201 of the substrate 200. In addition, the memory cell array 110A may include a second metal line ML2 stacked on the second front contact FC2. The second front contact FC2 may be conductor or include a conductive material.

According to an example embodiment, the second variable resistor VR2 is disposed on the second metal line ML2. Accordingly, the second variable resistor VR2 may be connected to a third source-drain electrode SD3 through the second metal line ML2 and the second front contact FC2.

However, according to an example embodiment, at least a portion of the second metal line ML2 and the second front contact FC2 is omitted. Therefore, the second variable resistor VR2 may be connected to the third source-drain electrode SD3 through at least a portion of the second metal line ML2 and the second front contact FC2.

The second bitline BL2 may be connected to the third source-drain electrode SD3 through the second variable resistor VR2, the second metal line ML2, and the second front contact FC2.

For example, the second variable resistor VR1 may be connected between the second bitline BL2 and the third source-drain electrode SD3.

Referring to FIG. 1 and FIG. 4C, the second source-drain electrode SD2, the second gate electrode G2, and the third source-drain electrode SD3 may constitute the second cell transistor CT2.

Accordingly, the second gate electrode G2 of the second cell transistor CT2 may be connected to the second wordline WL2 disposed on the first surface 201 of the substrate 200.

In addition, the second source-drain electrode SD2 of the second cell transistor CT2 may be connected to the first source line SL1 disposed on the second surface 202 of the substrate 200.

For example, the second source-drain electrode SD2 of the second cell transistor CT2 may be connected to the first source line SL1 through a first back contact BC1.

Referring to the above configurations, the first cell transistor CT1 and the second cell transistor CT2 according to an embodiment share the second source-drain electrode SD2. Additionally, the first memory cell MC1 and the second memory cell MC2 may share the first source line SL1.

Accordingly, a semiconductor memory device 100 according to an example embodiment may include a memory cell array 110A having a relatively small area compared to the case in which a source line for each of the first memory cell MC1 and the second memory cell MC2 is additionally provided. For example, since the first memory cell MC1 and the second memory cell MC2 share the first source line SL1, only one source line is needed instead of two source lines to support two memory cells.

In addition, the semiconductor memory device 100 may include a memory cell array 110A having a relatively small area compared to the case in which the first bitline BL1, the second bitline BL2, the first wordline WL1, the second wordline WL2, and the first source line SL1 are disposed together on the first surface 201.

Each of the first bitline BL1, the second bitline BL2, the first wordline WL1, the second wordline WL2, and the first source line SL1 may have a relatively large area compared to the case in which they are disposed together on the first surface 201.

At least a portion of the first front contact FC1, the second front contact FC2, and the first back contact BC1 may have a relatively large area compared to the case in which the first bitline BL1, the second bitline BL2, the first wordline WL1, the second wordline WL2, and the first source line SL1 are disposed together on the first surface 201.

Thus, the semiconductor memory device 100 may reduce a resistance value of at least a portion of the components included in each memory cell (for example, MC1 or MC2). For example, a resistance value of the semiconductor memory device 100 may be a first value when it includes the memory cell arrays according to embodiments of the inventive concept described herein, but a second value higher than the first value when it includes previous memory cell arrays.

As a result, the semiconductor memory device 100 may increase the power efficiency of an operation of reading data from each memory cell (for example, MC1 or MC2) of the memory cell array 110A.

FIG. 5A is a plan view illustrating a first surface of a substrate, on which a plurality of metal lines are disposed, according to an example embodiment, FIG. 5B is a bottom view illustrating a second surface of the substrate of FIG. 5A on which a first source line is disposed, and FIG. 5C is a cross-sectional view of the substrate of FIGS. 5A and 5B, taken along line B-B'.

Referring to FIG. 5A to FIG. 5C, a memory cell array 110B according to an example embodiment includes a second source line SL2 disposed on a first surface 201 and a first source line SL1 disposed on a second surface 202.

The memory cell array 110B and the first memory cell MC1 illustrated in FIG. 5A to FIG. 5C may be understood as examples of the memory cell array 110 and the first memory cell MC1 illustrated in FIG. 2. Additionally, the second memory cell MC2 illustrated in FIG. 5A to FIG. 5C may be understood as examples of the second memory cell MC2 illustrated in FIG. 4A to FIG. 4C.

Therefore, the same or substantially the same components are represented by the same reference numerals, and redundant descriptions thereof will be omitted.

According to an example embodiment, the memory cell array 110B includes a second memory cell MC2 disposed adjacent to the first memory cell MC1. For example, the memory cell array 110B may include a second memory cell MC2 disposed adjacent to the first memory cell MC1 in a first direction (for example, a positive X-direction).

According to an example embodiment, a first bitline BL1, a second bitline BL2, a first wordline WL1, a second wordline WL2, and a second source line SL2 are formed on a first surface 201 of a substrate 200.

In an embodiment, the second source line SL2 is formed on the first surface 201. The second source line SL2 may extend in the first direction (for example, the positive X-direction). In an embodiment, the second source line SL2 has a second width W2 in the second direction and the second width W2 is smaller than the first width W1.

In addition, a first source-drain electrode SD1 to a third source-drain electrode SD3 may be formed through at least a portion of the surface and an interior of the substrate 200. For example, the first source-drain electrode SD1 to the third source-drain electrode SD3 may be formed to extend inwardly of the substrate 200 from the first surface 201. For example, the first source-drain electrode SD1 to the third source-drain electrode SD3 may extend into an interior of the substrate 200.

Referring to FIG. 5B, the first source line SL1 according to an example embodiment is disposed on the second surface 202 of the substrate 200.

For example, the first source line SL1 may be formed on the second surface 202 of the substrate 200, and may extend in the first direction (for example, the positive X-direction) with a first width W1.

Referring to FIG. 5A and FIG. 5B, the second source line SL2 according to an example embodiment is formed to have a second width W2 smaller than the first width W1 of the first source line SL1. The widths W1 and W2 may be in the first direction (e.g., the Y-direction).

Referring to FIG. 5C, the first memory cell MC1 according to an example embodiment includes a first variable resistor VR1 connected to the first bitline BL1.

According to an example embodiment, the first variable resistor VR1 is connected to the first source-drain electrode SD1 through the first metal line ML1 and the first front contact FC1. In addition, the first bitline BL1 may be connected to the first source-drain electrode SD1 through the first variable resistor VR1, the first metal line ML1, and the first front contact FC1.

The second memory cell MC2 according to an example embodiment includes a second variable resistor VR2 connected to the second bitline BL2.

According to an example embodiment, the second variable resistor VR2 is connected to the third source-drain electrode SD3 through the second metal line ML2 and the second front contact FC2. In addition, the second bitline BL2 may be connected to the third source-drain electrode SD3 through the second variable resistor VR2, the second metal line ML2, and the second front contact FC2.

In an embodiment, the memory cell array 110B includes a connecting member CM formed to penetrate through the substrate 200. For example, the memory cell array 110B may include a connecting member CM formed to penetrate through the substrate 200 from the second surface 202. In an embodiment, the connecting member CM is a conductor or includes a conductive material.

The connecting member CM may be connected to the first source line SL1 through the second surface 202. In addition, the connecting member CM may be connected to a third front contact FC3 disposed on the first surface 201 through the first surface 201.

The second source line SL2 may be disposed on the third front contact FC3.

Accordingly, the first source line SL1 and the second source line SL2 may be connected to each other through the connecting member CM and the third front contact FC3 penetrating through the substrate 200. In an embodiment, the connecting member CM is a conductor or a conductive element.

For example, the connecting member CM may be referred to as small power tap cell (sPTC), but example embodiments are not limited thereto.

Referring to FIG. 2 and FIG. 5C, the first source-drain electrode SD1, the first gate electrode G1, and the second source-drain electrode SD2 may constitute a first cell transistor CT1.

A first gate electrode G1 of the first cell transistor CT1 may be connected to the first wordline WL1 disposed on the first surface 201 of the substrate 200.

Referring to FIG. 1 and FIG. 5C, the second source-drain electrode SD2, the second gate electrode G2, and the third source-drain electrode SD3 may constitute a second cell transistor CT2.

The second gate electrode G2 of the second cell transistor CT2 may be connected to the second wordline WL2 disposed on the first surface 201 of the substrate 200.

According to an example embodiment, the second source-drain electrode SD2 is connected to the first source line SL1 and the second source line SL2.

For example, the second source-drain electrode SD2 may be connected to the first source line SL1 and the second source line SL2 through the connecting member CM.

For example, the second source-drain electrode SD2 may be connected to the first source line SL1 disposed on the second surface 202 of the substrate 200 through at least a portion of the connecting member CM. In addition, the second source-drain electrode SD2 may be connected to the second source line SL2 disposed on the first surface 201 of the substrate 200 through at least a portion of the connecting member CM.

Referring to the above-mentioned configurations, the first cell transistor CT1 and the second cell transistor CT2 according to an example embodiment may share the second source-drain electrode SD2. In addition, the first memory cell MC1 and the second memory cell MC2 may share the first source lines SL1 and second source lines SL2 connected to each other.

Accordingly, the semiconductor memory device 100 according to an example embodiment may include a memory cell array 110B having a relatively small area compared to the case in which source lines for each of the first memory cell MC1 and the second memory cell MC2 are additionally included.

In addition, the semiconductor memory device 100 may increase an area of the source lines connected to the first memory cell MC1 and the second memory cell MC2 through the source lines SL1 and SL2, respectively disposed on the first surface 201 and second surface 202 to each other.

Thus, the semiconductor memory device 100 may reduce the resistance values of the source lines SL1 and SL2 connected to each memory cell (for example, MC1 or MC2) of the memory cell array 110B.

As a result, the semiconductor memory device 100 according to an example embodiment may increase the power efficiency of an operation of reading data from each memory cell (for example, MC1 or MC2) of the memory cell array 110B.

In addition, the semiconductor memory device 100 may enhance the accuracy of the operation of reading data from each memory cell (for example, MC1 or MC2) of the memory cell array 110B.

FIG. 6A is a plan view illustrating a first surface of a substrate, on which a plurality of metal lines are disposed, according to an example embodiment, FIG. 6B is a bottom view illustrating a second surface of the substrate of FIG. 6A on which a first additional wordline and a second additional wordline are disposed, and FIG. 6C is a cross-sectional view of the substrate of FIGS. 6A and 6B, taken along line C-C".

Referring to FIG. 6A to FIG. 6C, a memory cell array 110C according to an example embodiment includes a first additional wordline AWL1 and a second additional wordline AWL2 formed on a second surface 202 of a substrate 200.

The memory cell array 110C and the first memory cell MC1 illustrated in FIG. 6A to FIG. 6C may be understood as examples of the memory cell array 110 and the first memory cell MC1 illustrated in FIG. 2. In addition, the second memory cell MC2 illustrated in FIG. 6A to FIG. 6C may be understood as an example of the second memory cell MC2 illustrated in FIG. 4A to FIG. 4C.

Therefore, the same or substantially the same components are represented by the same reference numerals, and redundant descriptions thereof will be omitted.

According to an example embodiment, the memory cell array 110C includes the second memory cell MC2 disposed adjacent to the first memory cell MC1.

A first bitline BL1, a second bitline BL2, a first wordline WL1, a second wordline WL2, and a first source line SL1 may be formed on a first surface 201 of the substrate 200.

For example, each of the first wordline WL1 and the second wordline WL2 may be formed to extend in a first direction (for example, a positive X-direction) perpendicular to a second direction (for example, a positive Y-direction), on the first surface 201 of the substrate 200.

In addition, for example, the first source line SL1 may be formed to extend in the first direction (for example, the positive X-direction) on the first surface 201.

In addition, the first source-drain electrode SD1 to the third source-drain electrode SD3 may be formed to extend inwardly of the substrate 200 from the first surface 201 of the substrate 200. For example, the first source-drain electrode SD1 to the third source-drain electrode SD3 may extend inside the substrate 200.

Referring to FIG. 6B, the first additional wordlines AWL1 and the second additional wordlines AWL2 according to an example embodiment are disposed on the second surface 202 of the substrate 200.

For example, each of the first additional wordlines AWL1 and the second additional wordlines AWL2 may be formed to extend in a second direction (for example, a positive Y-direction) on the second surface 202 of the substrate 200. The first additional wordlines AWL1 and the second additional wordlines AWL2 may be spaced from one another in the first direction (e.g., an X-direction).

However, the arrangement of the first additional wordlines AWL1 and the second additional wordlines AWL2 is not limited to the above-described example.

Referring to FIG. 6C, the first memory cell MC1 according to an example embodiment includes a first variable resistor element VR1 connected to the first bitline BL1.

According to an example embodiment, the first variable resistor element VR1 is connected to the first source-drain electrode SD1 through a first metal line ML1 and a first front contact FC1. In addition, the first bitline BL1 may be connected to the first source-drain electrode SD1 through the first variable resistor element VR1, the first metal line ML1, and the first front contact FC1.

For example, the first variable resistor element VR1 may be connected between the first bitline BL1 and the first source-drain electrode SD1.

In addition, the second memory cell MC2 according to an example embodiment includes a second variable resistor element VR2 connected to the second bitline BL2.

According to an example embodiment, the second variable resistor element VR2 is connected to the third source-drain electrode SD3 through the second metal line ML2 and the second front contact FC2. In addition, the second bitline BL2 may be connected to the third source-drain electrode SD3 through the second variable resistor element VR2, the second metal line ML2, and the second front contact FC2.

For example, the second variable resistor element VR2 may be connected between the second bitline BL2 and the third source-drain electrode SD3.

Referring to FIG. 2 and FIG. 6C, the first source-drain electrode SD1, the first gate electrode G1, and the second source-drain electrode SD2 may constitute the first cell transistor CT1.

According to an example embodiment, a first gate electrode G1 of the first cell transistor CT1 is connected to the first wordline WL1 and the first additional wordline AWL1.

For example, the first gate electrode G1 may be connected to the first wordline WL1 disposed on the first surface 201 of the substrate 200.

In addition, the first gate electrode G1 may be connected to the first additional wordline AWL1 disposed on the second surface 202 of the substrate 200.

In an embodiment, the first additional wordline AWL1 is connected to the first gate electrode G1 through a second back contact BC2 formed to extend inwardly of the substrate 200 through the second surface 202 of the substrate 200. For example, the second back contact BC2 may extend inside the substrate 200. The second back contact BC2 may be a conductor or include a conductive material.

In addition, the first source line SL1 may be connected to the second source-drain electrode SD2 through a third front contact FC3 formed on the first surface 201.

Referring to FIG. 1 and FIG. 6C, the second source-drain electrode SD2, the second gate electrode G2, and the third source-drain electrode SD3 may constitute a second cell transistor CT2.

According to an example embodiment, a second gate electrode G2 of the second cell transistor CT2 is connected to the second wordline WL2 and the second additional wordline AWL2.

For example, the second gate electrode G2 may be connected to the second wordline WL2 disposed on the first surface 201 of the substrate 200.

In addition, the second gate electrode G2 may be connected to the second additional wordline AWL2 disposed on the second surface 202 of the substrate 200.

In an embodiment, the second additional wordline AWL2 is connected to the second gate electrode G2 through a third back contact BC3 formed to extend inwardly of the substrate 200 through the second surface 202 of the substrate 200. For example, the third back contact BC3 may extend inside the substrate 200. The third back contact BC3 may be a conductor or include a conductive material.

Referring to the above-described configurations, each of the first memory cell MC1 and the second memory cell MC2 according to an example embodiment may be connected to a wordline having a large area.

For example, the first memory cell MC1 may be connected to the wordlines WL1 and AWL1 having a relatively large area, compared to the case in which it is connected to only the first wordline WL1 disposed on the first surface 201.

In addition, for example, the second memory cell MC2 may be connected to the wordlines WL2 and AWL2, each having a large area, compared to the case in which it is connected to only the second wordline WL2 disposed on the first surface 201.

For example, the semiconductor memory device 100 may increase an area of the wordline connected to each memory cell (for example, MC1 or MC2) through the additional wordlines AWL1 and AWL2 disposed on the second surface 202.

Thus, the semiconductor memory device 100 according to an example embodiment may reduce resistance values of the wordlines WL1, WL2, AWL1, and AWL2 connected to each memory cell (for example, MC1 or MC2) of the memory cell array 110C.

As a result, the semiconductor memory device 100 may increase power efficiency of an operation of reading data from each memory cell (for example, MC1 or MC2) of the memory cell array 110C.

In addition, the semiconductor memory device 100 may enhance the accuracy of the operation of reading data from each memory cell (for example, MC1 or MC2) of the memory cell array 110C.

FIG. 7A is a plan view illustrating a first surface of a substrate, on which a plurality of metal lines are disposed, according to an example embodiment, FIG. 7B is a bottom view illustrating a second surface of the substrate of FIG. 7A on which a first additional wordline and a second additional wordline are disposed, FIG. 7C is a cross-sectional view of the substrate of FIGS. 7A and 7B, taken along line D-D', and FIG. 7D is a cross-sectional view of the substrate in FIGS. 7A and 7B, taken along line E-E'.

Referring to FIG. 7A to FIG. 7C, a memory cell array 110D according to an example embodiment may include a first additional wordline AWL1 and a second additional wordline AWL2 formed on a second surface 202 of a substrate 200.

At least a portion of the memory cell array 110D illustrated in FIG. 7A to FIG. 7C may be understood as an example of the components of the memory cell array 110C illustrated in FIG. 6A to FIG. 6C.

Therefore, the same or substantially the same components are represented by the same reference numerals, and redundant descriptions thereof will be omitted.

Referring to FIG. 7A, a first bitline BL1, a second bitline BL2, a first wordline WL1, a second wordline WL2, and a first source line SL1 may be disposed on a first surface 201 of a substrate 200. In addition, a memory cell array 110D according to an example embodiment includes a first metal member MM1 and a second metal member MM2 disposed on the first surface 201 of the substrate 200.

In addition, a first source-drain electrode SD1 to a fifth source-drain electrode SD5 may be formed through at least a portion of the surface and an interior of the substrate 200. For example, the first source-drain electrode SD1 to the fifth source-drain electrode SD5 may be formed to extend inwardly of the substrate 200 from the first surface 201 of the substrate 200. For example, the first source-drain electrode SD1 to the fifth source-drain electrode SD5 may extend inside the substrate 200.

The first source-drain electrode SD1 to the third source-drain electrode SD3 may be understood to have substantially the same configuration as the first source-drain electrode SD1 to the third source-drain electrode SD3 illustrated in FIG. 4A.

Referring to FIG. 7B, the first additional wordline AWL1 and the second additional wordline AWL2 according to an example embodiment may be disposed on a second surface 202 of the substrate 200.

Referring to FIG. 7C, the memory cell array 110D may include a first connecting member CM1 and a second connecting member CM2, each penetrating through the substrate 200.

The first connecting member CM1 may be formed to penetrate through a region corresponding to a fourth source-drain electrode SD4 in the substrate 200. In addition, the second connecting member CM2 may be formed to penetrate through a region corresponding to a fifth source-drain electrode SD5 in the substrate 200.

In addition, the memory cell array 110D may include a first metal member MM1 and a second metal member MM2, respectively connected to the first connecting member CM1 and the second connecting member CM2, on the first surface 201.

For example, the memory cell array 110D may include the first metal member MM1 connected to the first connecting member CM1 and the first wordline WL1 on the first surface 201.

In addition, the memory cell array 110D may include the second metal member MM2 connected to the second connecting member CM2 and the second wordline WL2 on the first surface 201.

The first wordline WL1 may be connected to the first additional wordline AWL1 through the first metal member MM1 and the first connecting member CM1.

The second wordline WL2 may be connected to the second additional wordline AWL2 through the second metal member MM2 and the second connecting member CM2.

For example, each of the first connecting member CM1 and the second connecting member CM2 may be referred to as a small power tap cell (sPTC), but example embodiments are not limited thereto. The connecting members CM1 and CM2 may be conductors or include a conductive material.

The first source line SL1 may be connected to the second source-drain electrode SD2 through the third front contact FC3 formed on the first surface 201 of the substrate 200.

Referring to FIG. 7D, the first memory cell MC1 according to an example embodiment includes a first variable resistor VR1 connected to the first bitline BL1.

According to an example embodiment, the first variable resistor VR1 is connected to the first source-drain electrode SD1 through the first metal line ML1 and the first front contact FC1. In addition, the first bitline BL1 may be connected to the first source-drain electrode SD1 through the first variable resistor VR1, the first metal line ML1, and the first front contact FC1.

The second memory cell MC2 according to an example embodiment includes a second variable resistor VR2 connected to the second bitline BL2.

According to an example embodiment, the second variable resistor VR2 is connected to the third source-drain electrode SD3 through the second metal line ML2 and the second front contact FC2. In addition, the second bitline BL2 may be connected to the third source-drain electrode SD3 through the second variable resistor VR2, the second metal line ML2, and the second front contact FC2.

Referring to FIG. 2, FIG. 7C, and FIG. 7D, the first source-drain electrode SD1, the first gate electrode G1, and the second source-drain electrode SD2 may constitute a first cell transistor CT1.

A first gate electrode G1 of the first cell transistor CT1 may be connected to the first wordline WL1 and the first additional wordline AWL1.

For example, the first gate electrode G1 may be connected to the first wordline WL1 disposed on the first surface 201.

In addition, the first gate electrode G1 may be connected to the first additional wordline AWL1 disposed on the second surface 202.

For example, the first gate electrode G1 may be connected to the first additional wordline AWL1 through the first wordline WL1, the first connecting member CM1, and the first metal member MM1.

Referring to FIG. 1, FIG. 7C, and FIG. 7D, the second source-drain electrode SD2, the second gate electrode G2, and the third source-drain electrode SD3 may constitute a second cell transistor CT2.

The second gate electrode G2 of the second cell transistor CT2 may be connected to the second wordline WL2 and the second additional wordline AWL2.

For example, the second gate electrode G2 may be connected to the second wordline WL2 disposed on the first surface 201 of the substrate 200.

For example, the second gate electrode G2 may be connected to the second additional wordline AWL2 through the second wordline WL2, the second connecting member CM2, and the second metal member MM2.

Referring to the above-described configurations, each of the first memory cell MC1 and the second memory cell MC2 according to an example embodiment may be connected to wordlines having a large area.

For example, the first memory cell MC1 may be connected to the wordlines WL1 and AWL1 having a relatively large area compared to the case in which it is connected to only the first wordline WL1 disposed on the first surface 201.

For example, the second memory cell MC2 may be connected to wordlines having a relatively wide area compared to the case where it is only connected to the second wordline WL2 disposed on the first surface 201.

For example, the semiconductor memory device 100 may increase an area of a wordline connected to each memory cell (for example, MC1 or MC2) through additional wordlines AWL1 and AWL2 disposed on the second surface 202.

The additional wordlines AWL1 and AWL2 may be connected to the wordlines WL1 and WL2 disposed on the first surface 201 through the connecting members CM1 and CM2 formed to penetrate through the substrate 200, respectively.

Thus, the semiconductor memory device 100 according to an example embodiment may reduce resistance values of the wordlines WL1, WL2, AWL1, and AWL2 connected to each memory cell (for example, MC1 or MC2) of the memory cell array 110D.

As a result, the semiconductor memory device 100 may increase the power efficiency of an operation of reading data from each memory cell (for example, MC1 or MC2) of the memory cell array 110D.

In addition, the semiconductor memory device 100 may enhance the accuracy of the operation of reading data from each memory cell (for example, MC1 or MC2) of the memory cell array 110D.

FIG. 8A is a plan view illustrating a first surface of a substrate, on which a plurality of metal lines are disposed, according to an example embodiment, FIG. 8B is a bottom view illustrating a second surface of the substrate of FIG. 8A on which a first additional wordline and a first source line are disposed, and FIG. 8C is a cross-sectional view of the substrate of FIGS. 8A and 8B, taken along line F-F'.

Referring to FIG. 8A to FIG. 8C, a memory cell array 110E according to an example embodiment includes a first source line SL1 and a first additional wordline AWL1 disposed on a second surface 202 of a substrate 200.

The memory cell array 110E illustrated in FIG. 8A to FIG. 8C may be understood as an example of the memory cell array 110 illustrated in FIG. 1.

Referring to FIG. 8A, a first bitline BL1, a second bitline BL2, a first wordline WL1, and a second wordline WL2 may be formed on a first surface 201 of the substrate 200.

A first source-drain electrode SD1 to a third source-drain electrode SD3 may be formed to extend inwardly of the substrate 200 from the first surface 201 of the substrate 200. For example, the first source-drain electrode SD1 to a third source-drain electrode SD3 may be formed inside the substrate 200.

Referring to FIG. 8B, a first additional wordline AWL1 and a first source line SL1 according to an example embodiment may be disposed on the second surface 202 of the substrate 200.

For example, the first additional wordline AWL1 may be formed to extend in a second direction (for example, a positive Y-direction), perpendicular to a first direction (for example, a positive X-direction), on the second surface 202.

For example, the first source line SL1 may be formed to extend in the first direction (for example, the positive X-direction) on the second surface 202. The first source line SL1 may be formed to have a first width W1. The first width W1 may be in the second direction.

According to an example embodiment, the first source line SL1 is formed to overlap at least a portion of the first bitline BL1 and the second bitline BL2 when viewed from a third direction (a positive Z-direction), perpendicular to the first direction (the positive X-direction) and the second direction (the positive Y-direction).

Referring to FIG. 8C, a memory cell array 110E may include a first back contact BC1 and a second back contact BC2, each formed to extend inwardly of the substrate 200 from the second surface 202. For example, the first back contact BC1 and a second back contact BC2 may extend inside the substrate 200. The first back contact BC1 and the second back contact BC2 may be a conductor or include a conductive material.

For example, the memory cell array 110E may include a first back contact BC1 formed to extend inwardly of the substate 200 from the second surface 202.

In addition, the memory cell array 110E may include a first additional back contact BC1' connected to the first back contact BC1 on the second surface 202 to be disposed on the second surface 202. The first additional back contact BC1' may be a conductor or include a conductive material.

In addition, the memory cell array 110E may include a second back contact BC2 formed to extend inwardly of the substrate 200.

Referring to FIG. 2 and FIG. 8C, the first source-drain electrode SD1, the first gate electrode G1, and the second source-drain electrode SD2 may constitute a first cell transistor CT1.

A first gate electrode G1 of the first cell transistor CT1 may be connected to the first wordline WL1 and the first additional wordline AWL1.

For example, the first gate electrode G1 may be connected to the first wordline WL1 disposed on the first surface 201 of the substrate 200.

In addition, the first gate electrode G1 may be connected to the first additional wordline AWL1 disposed on the second surface 202 of the substrate 200. The first additional wordline AWL1 may be connected to the first gate electrode G1 through a second back contact BC2.

Referring to FIG. 1 and FIG. 8C, the second source-drain electrode SD2, the second gate electrode G2, and the third source-drain electrode SD3 may constitute a second cell transistor CT2.

The second source-drain electrode SD2 may be connected to the first source line SL1 through the first back contact BC1 and the first additional back contact BC1'.

Referring to the above-described configurations, the first memory cell MC1 according to an example embodiment may be connected to wordlines having a large area.

For example, the first memory cell MC1 may be connected to wordlines WL1 and AWL1 having a relatively large area compared to the case in which it is connected to only the first wordline WL1 disposed on the first surface 201.

For example, the semiconductor memory device 100 may increase an area of a wordline connected to the first memory cell MC1 through the first additional wordline AWL1 disposed on the second surface 202.

Thus, the semiconductor memory device 100 according to an example embodiment may reduce resistance values of the wordlines WL1 and AWL1 connected to each memory cell (for example, MC1) of the memory cell array 110E.

In addition, referring to the above-described configurations, the first source line SL1 according to an example embodiment may have a relatively large width (or area) compared to the case in which the first memory cell MC1, the first wordline WL1, the first bitline BL1, and the first source line SL1 are formed together on the first surface 201.

Accordingly, the semiconductor memory device 100 may reduce the resistance value of the first source line SL1.

As a result, the semiconductor memory device 100 may increase the power efficiency of an operation of reading data from each memory cell (for example, MC1 or MC2) of the memory cell array 110E.

In addition, the semiconductor memory device 100 may enhance the accuracy of the operation of reading data from each memory cell (for example, MC1 or MC2) of the memory cell array 110E.

FIG. 9 is a circuit diagram illustrating a configuration in which a control logic circuit according to an example embodiment reads data, stored in a memory cell array, using a sense amplifier.

Referring to FIG. 9, a semiconductor memory device 100A according to an example embodiment includes a control logic circuit 150, a sense amplifier 123, a memory cell array 110, and a reference cell array 910.

The semiconductor memory device 100A illustrated in FIG. 9 may be understood as an example of the semiconductor memory device 100 illustrated in FIG. 1. Therefore, the same or substantially the same components are represented by the same reference numerals, and redundant descriptions thereof will be omitted.

According to an example embodiment, the semiconductor memory device 100A includes a sense amplifier 123 connected to the memory cell array 110 and the reference cell array 910.

For example, the sense amplifier 123 may apply current to the memory cell array 110 and the reference cell array 910 under the control of the control logic circuit 150.

According to an example embodiment, the control logic circuit 150 applies read current to at least a portion of memory cells included in the reference cell array 910 and the memory cell array 110 using the sense amplifier 123.

For example, the control logic circuit 150 may apply read current to at least a portion of memory cells MC1 to MCn included in the memory cell array 110 through a plurality of bitlines BLs.

The control logic circuit 150 may apply a read current to a reference cell, included in the reference cell array 910, through a reference bitline BLref. For example, the read current applied to the reference cell array 910 may be referred to as reference current.

The reference cell array 910 may be understood to include a single reference cell, but example embodiments are not limited thereto. The reference cell array 910 may also be understood to include at least two reference cells.

Furthermore, the control logic circuit 150 may compare current, output from the reference cell array 910, with current output from the memory cell array 110.

For example, the control logic circuit 150 may identify current output from the memory cell array 110 through the plurality of source lines SLs. In addition, the control logic circuit 150 may identify the current output from the reference cell array 910 through a reference source line SLref.

Accordingly, the control logic circuit 150 may compare the current, output through the plurality of source lines SLs, with the current output through the reference source line SLref.

The control logic circuit 150 may read data stored in at least a portion of the memory cells MC1 to MCn included in the memory cell array 110, based on a result of the comparison.

Referring to FIGS. 2 and 9, the semiconductor memory device 100A may increase areas of the source line SL1 and the bitline BL1 through the first source line SL1 and the first bitline BL1 disposed on different surfaces of the substrate 200.

For example, in the semiconductor memory device 100A, source lines connected to each of the memory cells MC1 to MCn may be disposed on the second surface 202 of the substrate 200.

Thus, the semiconductor memory device 100A according to an example embodiment may increase areas of source lines and/or bitlines connected to each of the memory cells MC1 to MCn.

In addition, the semiconductor memory device 100A may reduce resistance values of the source lines and/or bitlines connected to each of the memory cells MC1 to MCn.

Accordingly, the semiconductor memory device 100A may reduce an impact of the resistance values of the source lines and/or the bitlines on applying read current to each of the memory cells MC1 to MCn, included in the memory cell array 110, and identifying output current.

As a result, the semiconductor memory device 100A may reduce mismatch occurring based on relative locations of the sense amplifier 123 and each of the memory cells MC1 to MCn in the memory cell array 110.

In addition, the semiconductor memory device 100A according to an example embodiment may enhance the accuracy of an operation of reading data stored in the memory cell array 110.

As described above, the semiconductor memory device 100 according to an example embodiment includes a first memory cell MC1 and a first bitline BL1 disposed on the first surface 201 of the substrate 200.

In addition, the semiconductor memory device 100 may include a first source line SL1 disposed on the second surface 202, parallel to the first surface 201 of the substrate 200, to be connected to the first cell transistor CT1.

The first source line SL1 may have a relatively large area (or width) compared to the case in which it is formed together with the first memory cell MC1, the first wordline WL1, and the first bitline BL1 on the first surface 201.

Thus, the semiconductor memory device 100 according to an example embodiment may significantly reduce a resistance value of the first source line SL1.

Due to the above-described configurations, the semiconductor memory device 100 according to an example embodiment may increase the power efficiency of an operation of reading data stored in the first memory cell MC1.

For example, the semiconductor memory device 100 may increase a read margin for the first memory cell MC1.

In addition, the first memory cell MC1 according to an example embodiment may have a relatively small area compared to the case in which the first bitline BL1 and the first source line SL1 are formed together on the first surface 201.

Thus, the semiconductor memory device 100 according to an example embodiment may significantly reduce a size of the first memory cell MC1 or the memory cell array 110.

According to an embodiment, the semiconductor memory device 100 may reduce resistance values of metal lines connected to the first memory cell MC1 through the first source line SL1 disposed on the second surface 202.

Accordingly, the semiconductor memory device 100A may reduce an impact of the resistance values of the source lines and/or the bitlines on applying read current to each of the memory cells MC1 to MCn, included in the memory cell array 110, and identifying output current.

As a result, the semiconductor memory device 100A may reduce mismatch occurring based on relative locations of the sense amplifier 123 and each of the memory cells MC1 to MCn in the memory cell array 110.

As set forth above, a semiconductor memory device according to an example embodiment includes a source line formed on one surface, which is not adjacent to a memory cell, of a substrate. As a result, the semiconductor memory device may significantly reduce the resistance of metal lines and an effect caused by the resistance of the metal lines.

While example embodiments have been shown and described above, it will be apparent to those skilled in the art that modifications and variations could be made without departing from the scope of the present inventive concept.

What is claimed is:

1. A semiconductor memory device comprising:

a first memory cell comprising a first variable resistor element and a first cell transistor connected to the first variable resistor element through a first source-drain electrode;

a substrate comprising a first surface connected to a second source-drain electrode of the first cell transistor and a second surface opposing the first surface;

a first bitline connected to the first source-drain electrode of the first cell transistor through the first variable resistor element;

a first source line having a first width, arranged on the second surface of the substrate and connected to the second source-drain electrode; and a second source line disposed on the first surface and electrically connected to the first source line.

2. The semiconductor memory device of claim 1, comprising:

a first back contact located inside the substrate and extending from the second surface, wherein the first source line is connected to the second source-drain electrode through the first back contact.

3. The semiconductor memory device of claim 2, comprising:

a first front contact connected to the first source-drain electrode on the first surface of the substrate; and a first metal line stacked on the first front contact, wherein the first bitline is connected to the first source-drain electrode through the first variable resistor element, the first front contact, and the first metal line.

4. The semiconductor memory device of claim 1, wherein the first variable resistor element comprises:

a first magnetic layer, a second magnetic layer, and a tunnel layer disposed between the first magnetic layer and the second magnetic layer, and wherein the first variable resistor element has different resistance values depending on a magnetization direction of the first magnetic layer and a magnetization direction of the second magnetic layer, which are formed depending on current applied through the first bitline.

5. The semiconductor memory device of claim 1, further comprising:

a first wordline connected to a first gate electrode of the first cell transistor on the first surface of the substrate.

6. The semiconductor memory device of claim 5, further comprising:

a first additional wordline disposed on the second surface of the substrate, wherein the first additional wordline is connected to the first gate electrode.

7. The semiconductor memory device of claim 1, further comprising:

a second memory cell disposed adjacent to the first memory cell and comprising a second variable resistor element and a second cell transistor; and a second bitline connected to a third source-drain electrode of the second cell transistor through the second variable resistor element, wherein the second cell transistor is connected to the first source line, disposed on the second surface of the substrate, through the substrate.

8. The semiconductor memory device of claim 1, further comprising:

a reference cell connected between a reference bitline and a reference source line; and a control logic circuit connected to the first memory cell and the reference cell, wherein the control logic circuit is configured to:

apply read current through the first bitline, the first source line, the reference bitline, and the reference source line; and identify data stored in the first memory cell based on a difference between a resistance formed in the first variable resistor element of the first memory cell and a resistance formed in the reference cell, depending on the read current.

9. The semiconductor memory device of claim 1, wherein the first variable resistor element comprises:

a first metal layer, a second metal layer, and an insulating layer disposed between the first metal layer and the second metal layer, and wherein the first variable resistor element has different resistance values depending on a magnitude of a magnetic field formed in the insulating layer through the first metal layer and the second metal layer.

10. The semiconductor memory device of claim 1, wherein:

the second source line has a second width, smaller than the first width, the first source line is electrically connected to the second source line through a connecting member that penetrates through the substrate.

11. A semiconductor memory device comprising:

a memory cell array comprising a plurality of memory cells, each comprising a variable resistor element and a cell transistor;

a first bitline and a first source line connected to a first memory cell, among the plurality of memory cells;

a substrate disposed between the first memory cell and the first source line, the substrate having a first surface adjacent to a first cell transistor and a second surface opposing the first surface; and a second source line disposed on the first surface and electrically connected to the first source line, wherein the first bitline is connected to the first cell transistor through a first variable resistor element of the first memory cell, and wherein the first source line is disposed on the second surface of the substrate and is connected to the first cell transistor.

12. The semiconductor memory device of claim 11, further comprising:

a first back contact that penetrates through at least a portion of an interior of the substrate from the second surface, wherein the first source line is connected to the first cell transistor through the first back contact.

13. The semiconductor memory device of claim 12, comprising:

a first front contact connected to the first cell transistor on the first surface of the substrate, wherein the first bitline is connected to the first cell transistor through the first variable resistor element and the first front contact.

14. The semiconductor memory device of claim 11, wherein the first variable resistor element comprises:

a first magnetic layer, a second magnetic layer, and a tunnel layer disposed between the first magnetic layer and the second magnetic layer, wherein the first variable resistor element has different resistance values depending on a magnetization direction of the first magnetic layer and a magnetization direction of the second magnetic layer, which are formed depending on current applied through the first bitline.

15. The semiconductor memory device of claim 11, wherein the first variable resistor element comprises:

a first metal layer, a second metal layer, and an insulating layer disposed between the first metal layer and the second metal layer, and wherein the first variable resistor element has different resistance values depending on a magnitude of a magnetic field formed in the insulating layer through the first metal layer and the second metal layer.

16. The semiconductor memory device of claim 11, wherein:

the second source line has a width smaller than a width of the first source line, the first source line is electrically connected to the second source line through a connecting member that penetrates through the substrate.

17. The semiconductor memory device of claim 11, further comprising:

a reference bitline and a reference source line connected to a reference cell, among the plurality of memory cells; and a control logic circuit connected to the first memory cell and the reference cell, wherein the control logic circuit is configured to:

apply a read current through the first bitline, the first source line, the reference bitline, and the reference source line; and identify data stored in the first memory cell based on a difference between a resistance formed in the first variable resistor element of the first memory cell and a resistance formed in the reference cell, depending on the read current.

18. The semiconductor memory device of claim 14, further comprising:

a first wordline connected to a gate electrode of the first cell transistor on the first surface of the substrate.

19. A semiconductor memory device comprising:

a first memory cell comprising a first variable resistor element and a first cell transistor connected to the first variable resistor element through a first source-drain electrode;

a substrate comprising a first surface connected to a second source-drain electrode of the first cell transistor and a second surface opposing the first surface;

a first bitline connected to the first source-drain electrode of the first cell transistor through the first variable resistor element;

a first wordline disposed on the first surface to connect to a first gate electrode of the first cell transistor;

a first additional wordline disposed on the second surface of the substrate and connected to the first gate electrode;

a first source line disposed on the second surface and connected to the second source-drain electrode; and a second source line disposed on the first surface and electrically connected to the first source line.

20. The semiconductor memory device of claim 19, further comprising:

a first back contact that penetrates through at least a portion of the substrate through the second surface, wherein the first source line is connected to the second source-drain electrode of the first cell transistor through the first back contact.

* * * * *